US009108388B2

(12) United States Patent
Egami et al.

(10) Patent No.: US 9,108,388 B2
(45) Date of Patent: Aug. 18, 2015

(54) BROADBAND ELECTROMAGNETIC WAVE-ABSORBER AND PROCESS FOR PRODUCING SAME

(75) Inventors: Yoshihiro Egami, Osaka (JP); Kunio Suzuki, Osaka (JP); Takao Tsuduki, Osaka (JP)

(73) Assignee: TAYCA CORPORATION, Osaka (JP)

( * ) Notice: Subject to any disclaimer, the term of this patent is extended or adjusted under 35 U.S.C. 154(b) by 932 days.

(21) Appl. No.: 13/063,788

(22) PCT Filed: Dec. 28, 2009

(86) PCT No.: PCT/JP2009/071744

§ 371 (c)(1), (2), (4) Date: Mar. 14, 2011

(87) PCT Pub. No.: WO2010/119593

PCT Pub. Date: Oct. 21, 2010

(65) Prior Publication Data

US 2011/0168440 A1 Jul. 14, 2011

(30) Foreign Application Priority Data

Apr. 16, 2009 (JP) ................................ 2009-099918

(51) Int. Cl.

*H01Q 17/00* (2006.01)
*G01S 7/03* (2006.01)

(Continued)

(52) U.S. Cl.

CPC ... *B32B 5/26* (2013.01); *B32B 5/08* (2013.01); *B32B 7/12* (2013.01); *B32B 9/00* (2013.01); *B32B 15/20* (2013.01); *B32B 27/02* (2013.01); *B32B 27/36* (2013.01); *D06M 15/3562* (2013.01); *D06M 15/3566* (2013.01);

(Continued)

(58) Field of Classification Search

USPC ........................................................ 342/1-4
See application file for complete search history.

(56) References Cited

U.S. PATENT DOCUMENTS 3,733,606 A * 5/1973 Johansson ......................... 342/3
3,806,928 A * 4/1974 Costanza .......................... 342/4

(Continued)

FOREIGN PATENT DOCUMENTS

JP 58-169997 A 10/1983
JP 3-163709 A 7/1991

(Continued)

OTHER PUBLICATIONS

International Preliminary Report on Patentability, dated Nov. 24, 2011, issued in corresponding PCT/JP2009/071744.

(Continued)

*Primary Examiner* — Peter Bythrow
(74) *Attorney, Agent, or Firm* — Millen, White, Zelano & Branigan, P.C.

(57) ABSTRACT

Disclosed is an electromagnetic wave absorbent which exhibits high electromagnetic wave absorption performance over a wide band. The electromagnetic wave absorbent contains a conductive fiber sheet which is obtained by coating a fiber sheet base with a conductive polymer and has a surface resistivity within a specific range. The conductive fiber sheet is formed by impregnating a fiber sheet base such as a nonwoven fabric with an aqueous oxidant solution that contains a dopant, and then bringing the resulting fiber sheet base into contact with a gaseous monomer for a conductive polymer, so that the monomer is oxidatively polymerized thereon.

11 Claims, 25 Drawing Sheets

(51) Int. Cl.

| | |
|---|---|
| ***B32B 5/26*** | (2006.01) |
| ***B32B 5/08*** | (2006.01) |
| ***B32B 7/12*** | (2006.01) |
| ***B32B 9/00*** | (2006.01) |
| ***B32B 15/20*** | (2006.01) |
| ***B32B 27/02*** | (2006.01) |
| ***B32B 27/36*** | (2006.01) |
| ***D06M 15/356*** | (2006.01) |
| ***H05K 9/00*** | (2006.01) |
| *G01S 13/88* | (2006.01) |

(52) U.S. Cl.

CPC ............. *H01Q17/00* (2013.01); *H01Q 17/004* (2013.01); *H01Q 17/005* (2013.01); *H05K 9/009* (2013.01); *D06M 2200/00* (2013.01); *G01S 7/03* (2013.01); *G01S 7/032* (2013.01); *G01S 13/88* (2013.01); *Y10T 156/10* (2015.01)

(56) References Cited

U.S. PATENT DOCUMENTS 4,001,827 A * 1/1977 Wallin et al. ...................... 342/3
4,012,738 A * 3/1977 Wright ............................. 342/1
4,034,375 A * 7/1977 Wallin ............................. 342/3
4,162,496 A * 7/1979 Downen et al. .................. 342/4
4,330,573 A * 5/1982 Kostandov et al. ........... 427/213
4,394,304 A * 7/1983 Wnek ...................... 252/519.21
4,401,545 A * 8/1983 Naarmann et al. ............ 204/291
4,435,465 A * 3/1984 Ebneth et al. ............. 428/195.1
4,439,768 A * 3/1984 Ebneth et al. .................... 342/5
4,473,826 A * 9/1984 Pusch et al. ...................... 342/5
4,495,239 A * 1/1985 Pusch et al. ................... 428/192
4,507,354 A * 3/1985 Ishikawa et al. .............. 442/232
4,521,450 A * 6/1985 Bjorklund et al. ............ 427/121
4,581,284 A * 4/1986 Eggert et al. .................. 442/391
4,604,427 A * 8/1986 Roberts et al. ................ 525/185
4,617,228 A * 10/1986 Newman et al. .............. 442/115
4,803,096 A * 2/1989 Kuhn et al. ................... 427/121
4,877,646 A * 10/1989 Kuhn et al. ................... 427/121
4,965,408 A * 10/1990 Chapman et al. ............. 174/363
4,975,317 A * 12/1990 Kuhn et al. ................... 442/115
4,981,718 A * 1/1991 Kuhn et al. ................... 427/121
5,003,311 A * 3/1991 Roth et al. ........................ 342/4
5,030,508 A * 7/1991 Kuhn et al. ................... 442/115
5,094,907 A * 3/1992 Yamamura et al. ........ 428/293.4
5,312,678 A * 5/1994 McCullough et al. ........ 442/189
5,325,094 A * 6/1994 Broderick et al. ................ 342/1
5,494,609 A * 2/1996 Kulkarni et al. .............. 252/500
RE35,278 E * 6/1996 Newman et al. ................ 442/29
5,537,116 A * 7/1996 Ishino et al. ...................... 342/1
5,576,710 A * 11/1996 Broderick et al. ................ 342/1
5,583,318 A * 12/1996 Powell .......................... 174/390
5,595,689 A * 1/1997 Kulkarni et al. .............. 252/500
5,597,471 A * 1/1997 Ragge et al. .................. 205/159
5,683,744 A * 11/1997 Jolly et al. .................... 427/121
5,721,551 A * 2/1998 Tran et al. ......................... 342/1
5,940,022 A * 8/1999 Takatsu ............................ 342/1
6,083,562 A * 7/2000 Rodriguez et al. ......... 427/393.1
6,097,327 A * 8/2000 Byquist et al. .................... 342/2
6,099,757 A * 8/2000 Kulkarni ....................... 252/500
6,551,661 B1 * 4/2003 Bugnet et al. ................. 427/301
6,700,525 B2 * 3/2004 Gustafsson ....................... 342/1
6,737,154 B2 * 5/2004 Jonza et al. ................... 428/215
6,979,479 B2 * 12/2005 Lavan et al. ................... 428/1.1
7,239,261 B2 * 7/2007 Fujieda et al. .................... 342/1
7,247,367 B2 * 7/2007 Nishinaka et al. ............ 428/220
7,511,653 B2 * 3/2009 Yu et al. ............................ 342/1
7,943,066 B2 * 5/2011 Ni et al. .................. 252/519.32
8,013,776 B2 * 9/2011 Child ................................ 342/1
8,325,079 B2 * 12/2012 Shah et al. ........................ 342/4
8,598,470 B2 * 12/2013 Kagawa ........................ 174/386
2001/0032701 A1 * 10/2001 Kawanaka et al. ........... 156/276
2006/0134359 A1 * 6/2006 Lavan et al. ................. 428/36.1
2007/0128963 A1 * 6/2007 Vogt et al. ..................... 442/301
2007/0196671 A1 * 8/2007 Kobayashi .................... 428/447
2009/0021415 A1 * 1/2009 Yu et al. ............................ 342/3
2009/0176074 A1 * 7/2009 Sotendahl et al. ............ 428/208
2009/0291608 A1 * 11/2009 Choi et al. .................... 442/394
2010/0006442 A1 * 1/2010 Lochtman et al. .............. 205/50
2010/0270069 A1 * 10/2010 Shar et al. ..................... 174/377
2011/0095931 A1 * 4/2011 Child ................................ 342/3
2012/0162001 A1 * 6/2012 Sim .................................. 342/4
2013/0050006 A1 * 2/2013 Sim .................................. 342/4
2013/0177768 A1 * 7/2013 Kruger et al. ................. 428/412

FOREIGN PATENT DOCUMENTS

JP 6-104093 A 4/1994
JP 9-331183 A 12/1997
JP 2006-156750 A 6/2006
JP 2007-169824 A 7/2007

OTHER PUBLICATIONS

International Search Report, dated Feb. 2, 2010, issued in corresponding PCT/JP2009/071744.

* cited by examiner

BROADBAND ELECTROMAGNETIC WAVE-ABSORBER AND PROCESS FOR PRODUCING SAME

FIELD OF THE INVENTION

The present invention relates to a broadband electromagnetic wave absorber, and also to a process for producing said absorber. Specifically, the present invention relates to a broadband electromagnetic wave absorber comprising a fabric sheet such as nonwoven fabric having a coating of an electroconductive polymer applied thereon under predetermined conditions in order to impart the fabric sheet with an electromagnetic wave-absorption property or both electromagnetic wave-absorption and shielding properties.

BACKGROUND ART

Electromagnetic waves propagated from various electrical and telecommunication devices are becoming a problem as a result of the rapid spread in recent years. The electromagnetic waves can interfere with the normal operation of other devices and may cause malfunction or noise. Electromagnetic waves are said to be injurious on human bodies when exposed to them.

For mobile devices such as mobile phones and portable computers in particular, various shielding materials are provided for the prevention of leakage of electromagnetic waves from the inside to the outside and vice versa. Since these shielding materials are often applied on non-flat irregular surfaces, it is desirable for the shielding materials to have flexibility. Although the shielding materials can protect the device to which they are applied by reflecting electromagnetic waves propagated from a source device, the reflected electromagnetic waves, in turn, may cause malfunction of another device. Accordingly, electromagnetic wave absorbers are more effective than the shielding materials for the prevention of malfunction of electrical devices used in a limited space.

As an example of electromagnetic wave-absorption materials having flexibility, rubber sheets incorporating magnetic or electroconductive particles are known. Another example is fabric sheets carrying carbon or other electroconductive particles.

The electromagnetic wave absorber of the rubber or fabric sheets of the above type, however, require to have a varying thickness depending upon a particular frequency band to be absorbed. Therefore, the flexibility of these materials is compromised depending upon the frequency band to be absorbed. Other disadvantages of the rubber type electromagnetic wave absorbers include their ability of absorption of electromagnetic waves only in limited frequency range and not in broadband frequency range. Moreover, they are not necessarily light weighted.

The electromagnetic wave absorbers of fabric type carrying electroconductive particles such as carbon powder are flexible and do not exhibit a frequency-dependent absorption peak. However, it is difficult to firmly fix carbon or other electroconductive particles onto the fabric sheet so that the electroconductive particles are not easily released. Moreover, a satisfactory electromagnetic wave absorption performance per unit volume cannot be achieved unless a sufficient quantity of the conductor particles is uniformly carried by the fibrous substrate.

Other fiber-based electromagnetic wave-shielding materials are known including the type having a metal foil adhered to one side of a fibrous sheet or sandwiched between a pair of the fibrous sheets.

The electromagnetic wave-shielding materials of the above type exhibit a satisfactory shielding performance. However, they are not permeable to air and thus block heat radiation from the source device. Heat radiation may be improved to some extend by the use of perforated metal foils but the effect is not sufficient. In addition, the use of fiber sheet-metal foil composite shielding materials may interfere with thinning the device. Use of perforated metal foils adds the production cost of the shielding material.

Other types of fiber-based electromagnetic wave-shielding materials are known including metal-carrying fabric sheets such as metallic fiber-containing fabric or metal vapor-deposited fibrous sheets.

The fiber-based shielding materials of the above types do not have a sufficient shielding effect to electromagnetic waves and the metal vapor-deposited fabric sheets are expensive because the manufacturing process is complicated.

Still other types of fiber-based electromagnetic wave-shielding materials are known including fabric sheets having electroless metal plating.

The fiber-based electromagnetic wave-shielding materials of the above type have a defect that the shielding effect for electromagnetic waves is not sufficiently high.

Recently, it has been proposed to improve the above defects by applying an electrolytic plating on the surface of fabric sheets having electroless metal plating or electroconductive polymer coating without adversely affecting the flexibility and gas-permeability of fabric sheets.

The fiber-based electromagnetic wave-shielding materials having dual layers of electrolytic plating in addition to electroless plating or conductive polymer coating may enhance the shielding effect to some extent. However, their manufacturing process requires complicated steps making the production thereof in a cost effect manner difficult. Especially, when the manufacturing process comprises electroless plating, several steps of etching and washing the substrate for activation are required before liberating elementary metal by a redox reaction for plating. These additional steps further affect the productibility and add production cost.

DISCLOSURE OF THE INVENTION

Problem to be Solved by the Invention

An object of the present invention is, therefore, to provide an electromagnetic wave absorber which exhibits a high absorption performance optionally combined with a high shielding performance for electromagnetic waves over a wide frequency range as evenly as possible.

Also, it is another object of the present invention to provide a process for manufacturing said electromagnetic wave absorber which allows the production of said material in a simple, highly productive and cost effective manner.

Means for Solving the Problem

As a result of intensive efforts, we have found that an electromagnetic wave absorber which exhibits a high absorption performance optionally combined with a high shielding performance for electromagnetic waves over a wide frequency range may be provided by coating a fabric sheet such as woven or nonwoven fabric with an electroconductive polymer under predetermined conditions to attain an electroconductive fabric sheet having a pre-determined surface resistivity.

Specifically, the present invention utilizes the process disclosed in JP 2007169824A for coating the fabric sheet with the electroconductive polymer. Using this process, a coating layer of electroconductive polymer is formed on the surface of a woven or nonwoven fabric made of synthetic fibers such that the resulting fabric thus treated has a surface resistivity between $1\times10^0$ Ohm/square and $1\times10^4$ Ohm/square. The surface resistivity within this range may be achieved without incorporating a metallic powder into the electroconductive polymer layer. As an electromagnetic wave-absorber, a single sheet having the surface resistivity of the above range or a laminate of two or more sheets thereof may be used as the electromagnetic wave absorber according to the present invention.

In another aspect, an electromagnetic wave absorber additionally exhibiting a high shielding performance may be obtained by adjusting the surface resistivity between $1\times10^0$ Ohm/square and $1\times10^3$ Ohm/square.

The materials, properties and other characteristics of starting fabric sheets are not limited. However, woven or nonwoven or their composite fabrics made of synthetic fibers are preferably used in order to attain a surface resistivity necessary for imparting the substrate with the electromagnetic wave absorption performance optionally combined with a high shielding performance.

As electroconductive polymers for coating the fabric sheet, polypyrrole, polythiophene or copolymers including derivatives thereof may preferably be used.

Since the electroconductivity is imparted with the electroconductive polymer in the present invention, it is not necessary for fibrous substrate sheets per se to be electroconductive. However, a fibrous sheet material comprising, at least in part, an electroconductive fiber such as carbon fiber or carbon or copper sulfide-coated fibers may be employed as the substrate for coating with the electroconductive polymer. In this case, the resulting electromagnetic wave absorber exhibits not only relatively even absorption but a strong absorption in a specific band region.

The electromagnetic wave absorber according to the present invention may comprise a metal foil adhered to at least one side thereof to enhance its absorption performance over a broadband frequency range.

When the electromagnetic wave absorber of the present invention is a laminate of two or more electroconductive fabric sheets, it is effective to laminate two or more electroconductive fabric sheets having varying surface resistivities in order to obtain an electromagnetic wave absorber exhibiting relatively even absorbance over a broadband frequency range.

In cases where the absorber is a laminate, a fabric sheet free from a coating of electroconductive polymer may be interposed between layers of the laminate and/or adhered to one or two sides of the laminate. This structure has an effect of elevating the overall absorption level for electromagnetic waves over a broadband frequency range. Another effect of this structure is to reinforce the mechanical or physical strength of the material without compromising the electromagnetic wave-absorption performance.

The electromagnetic wave-absorption material of the present invention exerts wave attenuation more than 10 dB, at least in part, in a frequency range of 1 GHz to 110 GHz.

The overall thickness of the absorber of the present invention may be controlled from 0.2 to 100 mm, preferably from 1 to 40 mm, more preferably from 5 to 30 mm regardless whether the material is a single sheet or of a laminate structure. This allows to retain a high flexibility without compromising other properties of the material.

The process for manufacturing the electromagnetic wave absorber of the present invention comprises the steps of:

(a) providing a fabric sheet selected from a woven or nonwoven fabric made of a synthetic fiber;

(b) impregnating said sheet with an aqueous solution of an oxidizing agent and a dopant;

(c) contacting the impregnated sheet with the monomer of an electroconductive polymer in vapor phase whereby said electroconductive polymer is formed on said fabric sheet in situ by the oxidation-polymerization of said monomer to obtain an electroconductive fabric sheet.

The process for manufacturing the electromagnetic wave absorber of the present invention may further comprise laminating a plurality of said electroconductive fabric sheets to obtain a laminate thereof.

Now the definition of some terms used herein will be given below.

The term "fabric sheet" refers to a sheet-like web of natural, synthetic or semi-synthetic fibers or a mixture of these fibers. The structure and shape of the fabric sheet may be, for example, woven, knitted or nonwoven fabrics. The fabric sheet used for manufacturing the electromagnetic wave absorber of the present invention must include fine interstices between fibers to receive various treating agents. Nonwoven fabrics made of ultra-fine fibers, typically ultra-fine polyester fibers are preferable where especially high absorption performance or shielding performance for electromagnetic waves are required.

"Polypyrrole" refers to not only homopolymers of pyrrole but also copolymers of pyrrole with a small proportion of homologs or derivatives of pyrrole copolymerizable with pyrrole such as N-methylpyrrole, 3-methylpyrrole, 3,5-dimethylpyrrole or 2,2'-bipyrrole.

"Polythiophene" refers to not only homopolymers of thiophene but also copolymers of thiophene with a small proportion of homologs or derivatives of thiophene copolymerizable with thiophene such as 3,4-ethylenedioxythiophene or 3,4-methylenedioxythiophene.

"Oxidizing agent" refers to an agent capable of oxidation-polymerizing monomeric pyrrole or thiophene. Examples of such oxidizing agents are described in a number of patent and non-patent literature such as U.S. Pat. Nos. 4,604,427, 4,521,450 and 4,617,228. They include ammonium per sulfate, iron (III) chloride, iron (III) sulfate, hydrogen peroxide, ammonium perborate and copper (II) chloride. Ferric salts of a sulfonic acid used as a dopant such as p-toluenesulfonic acid may also be used as the oxidizing agent.

"Dopant" refers to an anion capable of increasing the electroconductivity of electroconductive polymers. Preferable examples thereof are described in US patents cited above and include p-toluenesulfonic acid, benzenesulfonic acid, naphthalenesulfonic acid, dodecylbenzenesulfonic acid and sulfonated polystyrene.

Evaluation Method for Electromagnetic Wave-Absorption Performance

An apparatus for the measurement of electromagnetic wave-attenuation by the reflected power method is schematically shown in FIG. 1. As shown in FIG. 1, electromagnetic waves are transmitted from a transmission unit to impinge upon a sample of the electromagnetic wave absorber of the present invention at an incident angle. The reflected electromagnetic waves are received by a receiving unit. The magnitude of attenuation is evaluated in terms of decrease in wave intensity determined from the difference of electrical power between the incident and reflected electromagnetic waves. A double-ridge horn antenna is used for a frequency range between 1 GHz and 15 GHz while a plurality of antennas each adapted for respective frequency ranges are used for a frequency range between 10 GHz and 110 GHz.

Evaluation Method for Electromagnetic Wave-Shielding Performance

The shielding performance for electromagnetic waves is evaluated by measuring both reflection attenuation (S11) and transmission attenuation (S21) of a test specimen using microstrip measurement method. Materials exhibiting decrease in wave intensity of at least 5 dB, preferably, at least 10 dB in the sum of both measurements are considered to be usable in practice as an electromagnetic wave-shielding material.

Effects of the Invention

According to the present invention, an electromagnetic wave absorber which exhibits a high absorption performance optionally combined with a high shielding performance for electromagnetic waves in a broadband frequency range is provided by coating a fabric sheet such as nonwoven fabrics with an electroconductive polymer under pre-determined conditions for attaining a pre-determined surface resistivity. The electromagnetic wave absorber of the present invention does not compromise inherent properties of the fabric sheet such as flexibility and gas-permeability. A process, for producing such absorption materials in a simple, highly productive and cost effective manner is also provided in accordance with the present invention.

BEST MODE FOR CARRYING OUT OF THE INVENTION

The fabric sheet to be used in the present invention may be chosen from a variety of fabric sheets as defined above depending upon specific usage. The description given below is mainly directed to electromagnetic wave absorbers materials made from woven and nonwoven fabrics. However, particular fabric sheets and treating conditions may easily be determined by one skilled in the art depending upon particular usage and the nature of electroconductive polymers.

As stated earlier, the present invention employs the in situ polymerization technology on the fabric sheet as disclosed in JP 2007169824A in order to impart the substrate sheet with electroconductivity or surface resistivity.

EXAMPLES

The following examples and comparative examples are not intended to limit the present invention thereto. All parts and percents used therein are by weight unless otherwise specified.

The surface resistivity was measured using a surface resistivity meter available from DIA INSTRUMENTS under the name of Loresta EP MCP-T360 MCP-TP03P.

1. Evaluation Test for Electromagnetic Wave Absorption

1.1 Attenuation in Terms of Decrease in Intensity of Reflected of Electromagnetic Waves in the Frequency Range Between 10 GHz and 110 GHz

Example 1

A nonwoven fabric made of 100% ultra-fine polyester fiber having a basis weight of 150 g/$m^2$ and a thickness of 0.45 mm (WIPER-WO-ME150 available from Mitsubishi Paper Mills Ltd.) was cut into an elongated sheet of 50 cm width and 600 cm length. The cut nonwoven fabric was immersed in an aqueous solution containing 12% of ammonium persulfate and 14% of naphthalenesulfonic acid (pH 0.2) and squeezed by passing through a mangle to remove excessive solution. Then wet nonwoven fabric was placed in a reaction chamber in flattened state. The reaction chamber was filled with pyrrole vapor supplied from an evaporator within the chamber to allow in situ vapor phase polymerization of pyrrole monomer on the wet nonwoven fabric for 10 minutes. After the reaction, the nonwoven fabric was removed from the reaction chamber, washed with 10 L of distilled water three times, removing water using the mangle, and dried at 105° C. for 1 hour. The pick up of polypyrrole by the resulting nonwoven fabric was calculated as 1.6% from the difference in weight of the fabric before and after the treatment.

The resulting polypyrrole-coated nonwoven fabric was cut into 10 sheets of 50 cm×50 cm size and determined their surface resistivity. The average surface resistivity of 10 sheets was $7.3\times10^1$ Ohm/square.

Figure 1:
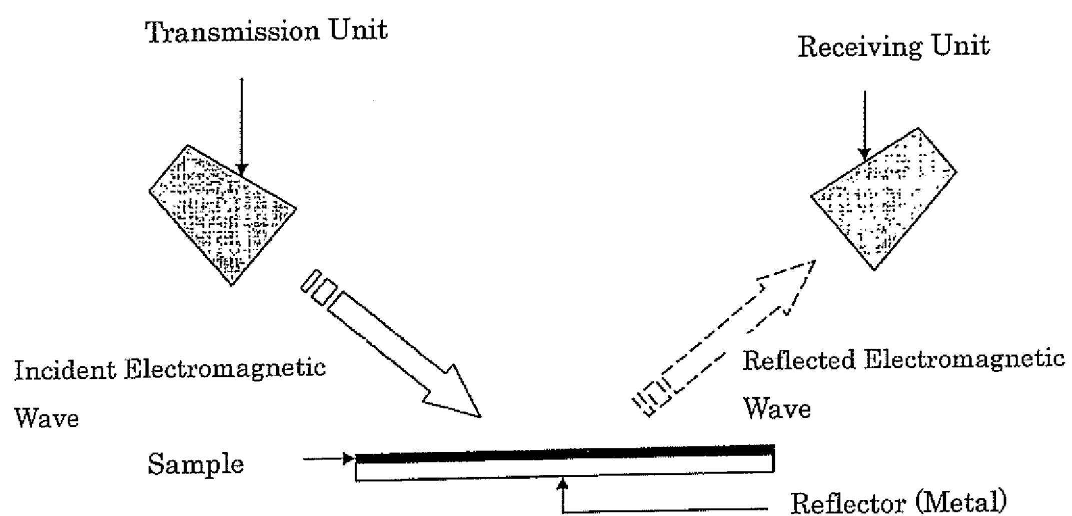
FIG. 1 schematically depicts an apparatus for measuring attenuation in terms of decrease in reflected wave intensity of electromagnetic waves.
Figure 2:
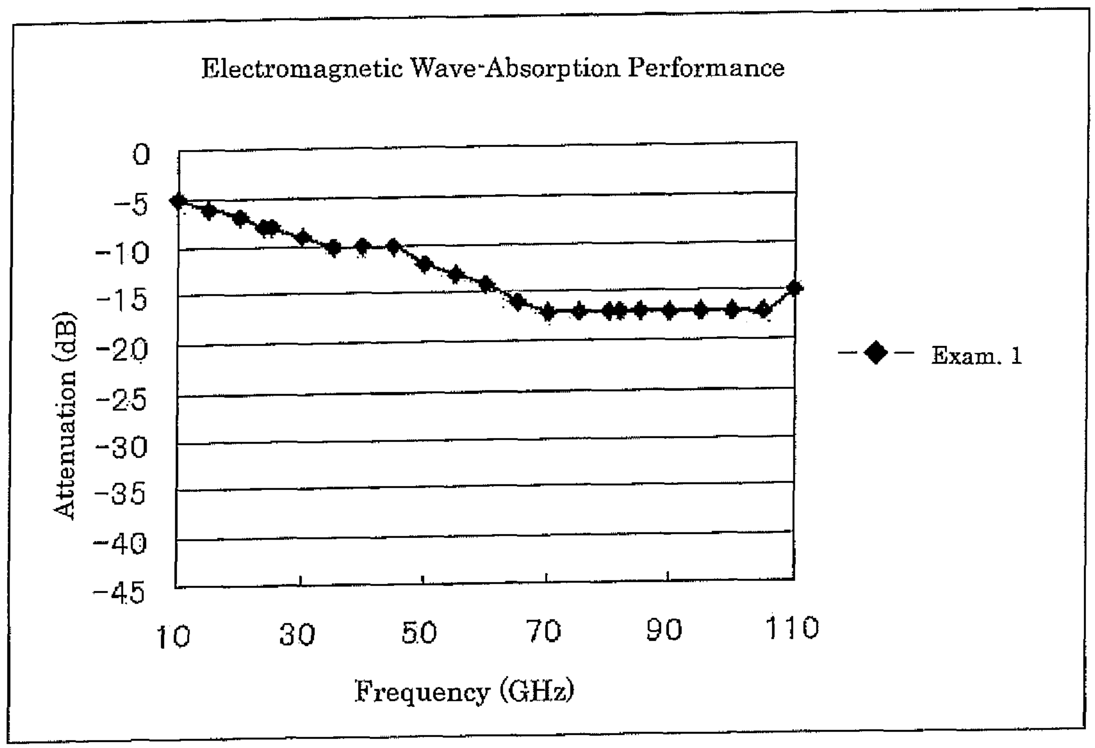
FIG. 2 is a graph showing the electromagnetic wave absorption performance of the material of Example 1 over a frequency range between 10 GHz and 110 GHz.
Figure 3:
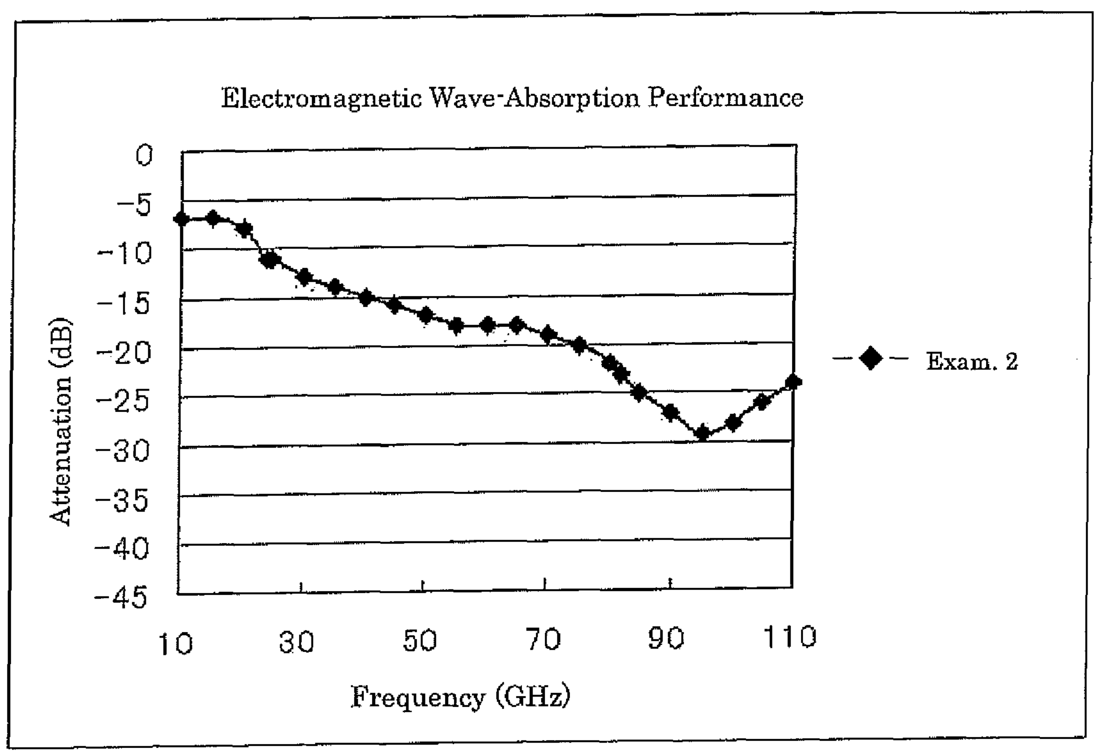
FIG. 3 is a graph similar to FIG. 2 showing the absorption performance of the material of Example 2.
Figure 4:
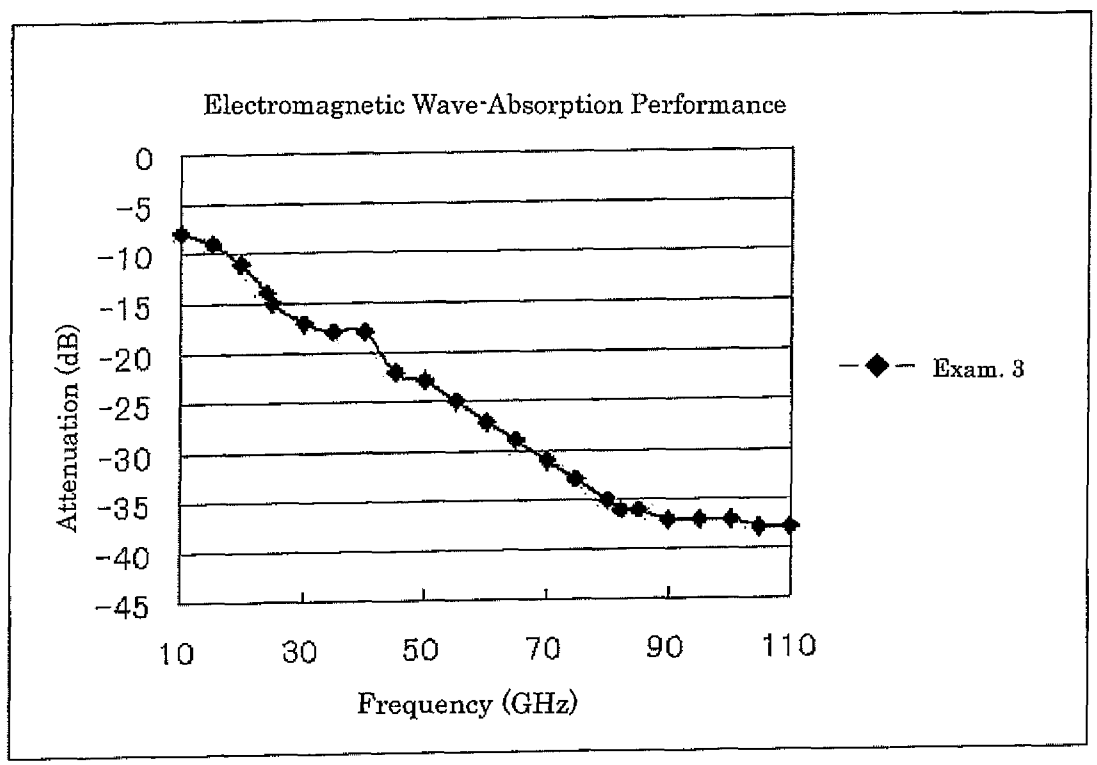
FIG. 4 is a graph similar to FIG. 2 showing the absorption performance of the product of Example 3.
Figure 5:
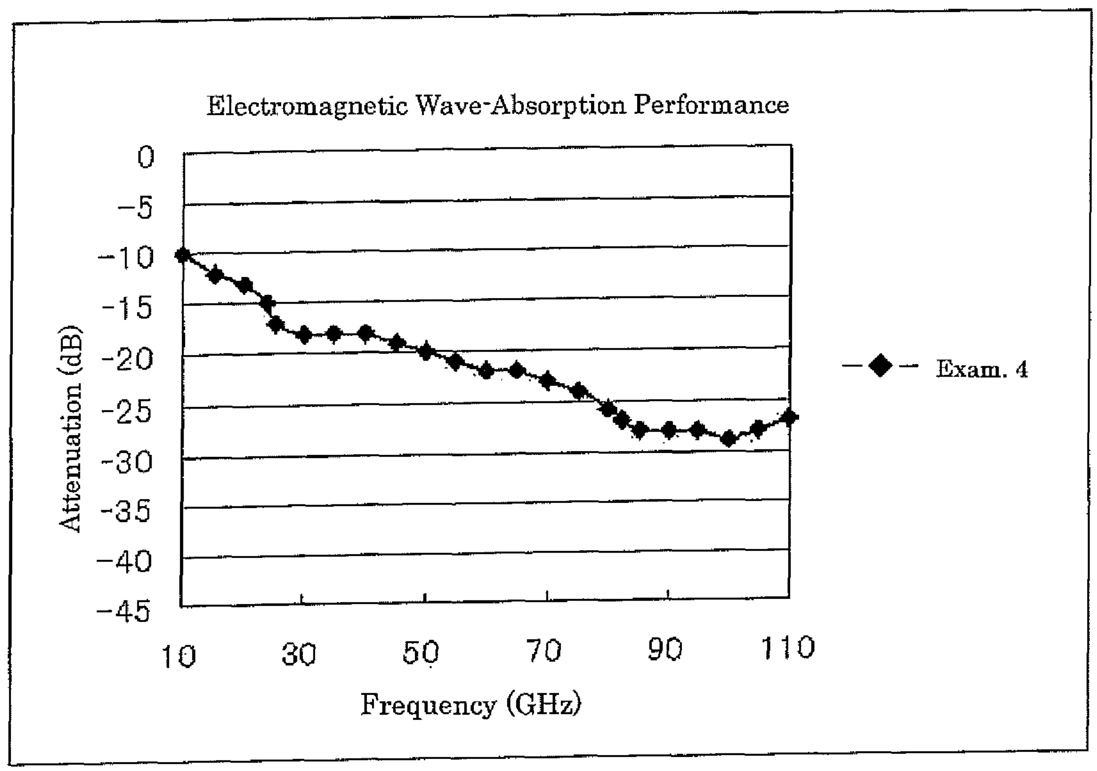
FIG. 5 is a graph similar to FIG. 2 showing the absorption performance of the material of Example 4.
Figure 6:
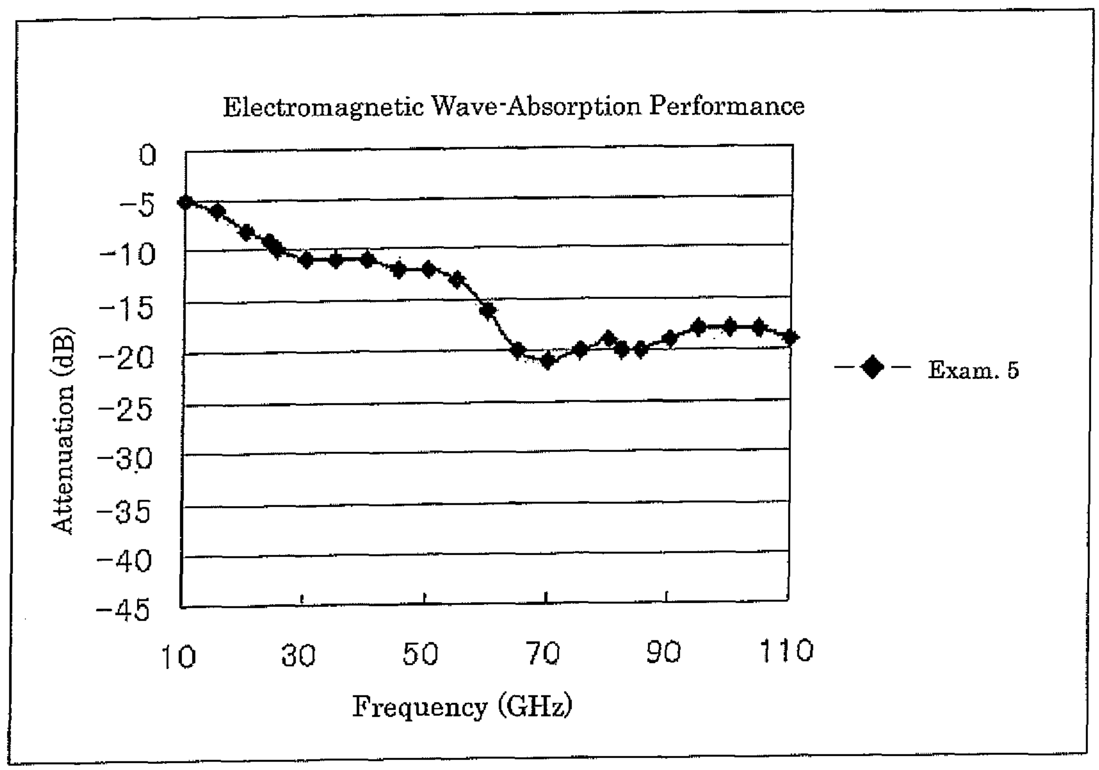
FIG. 6 is a graph similar to FIG. 2 showing the absorption performance of the material of Example 5.
Figure 7:
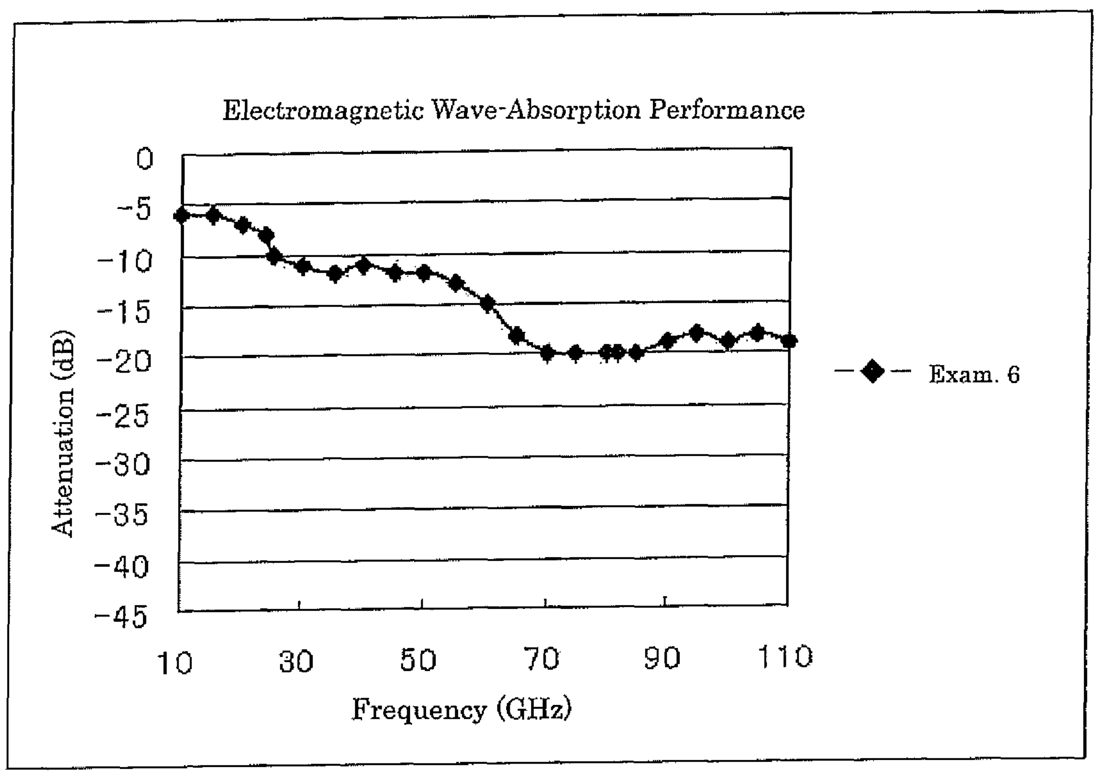
FIG. 7 is a graph similar to FIG. 2 showing the absorption performance of the material of Example 6.
Figure 8:
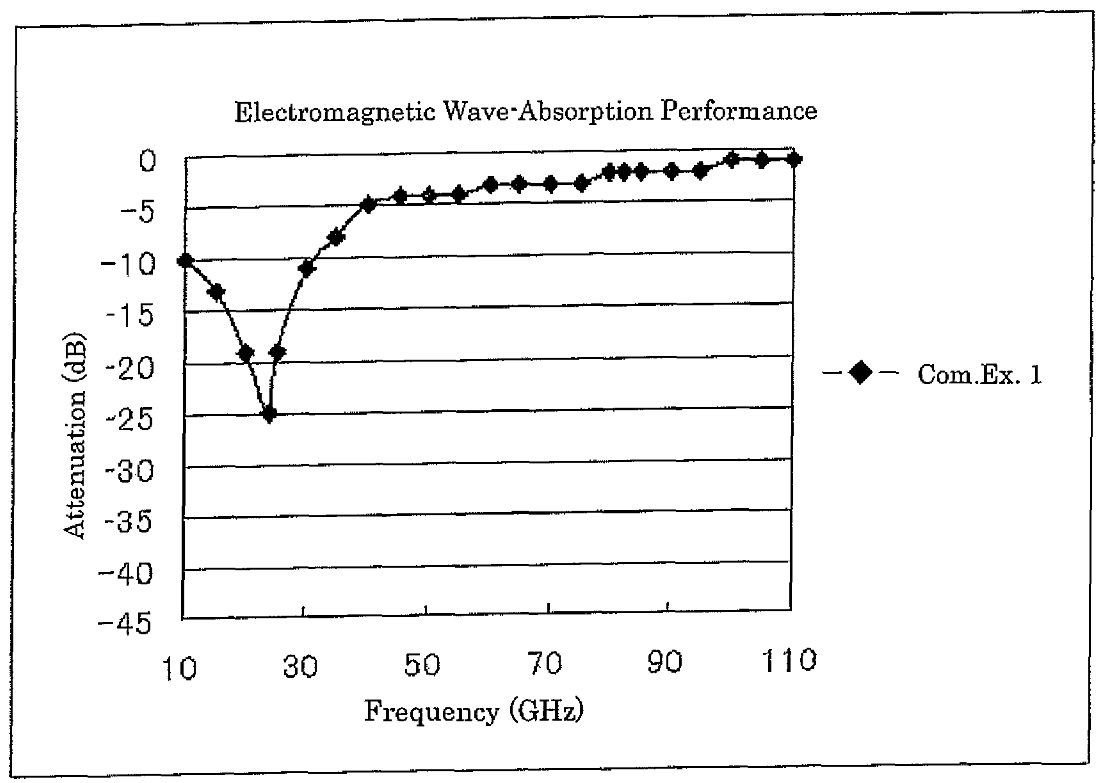
FIG. 8 is a graph similar to FIG. 2 showing the absorption performance of the material of Comparative Example 1.
Figure 9:
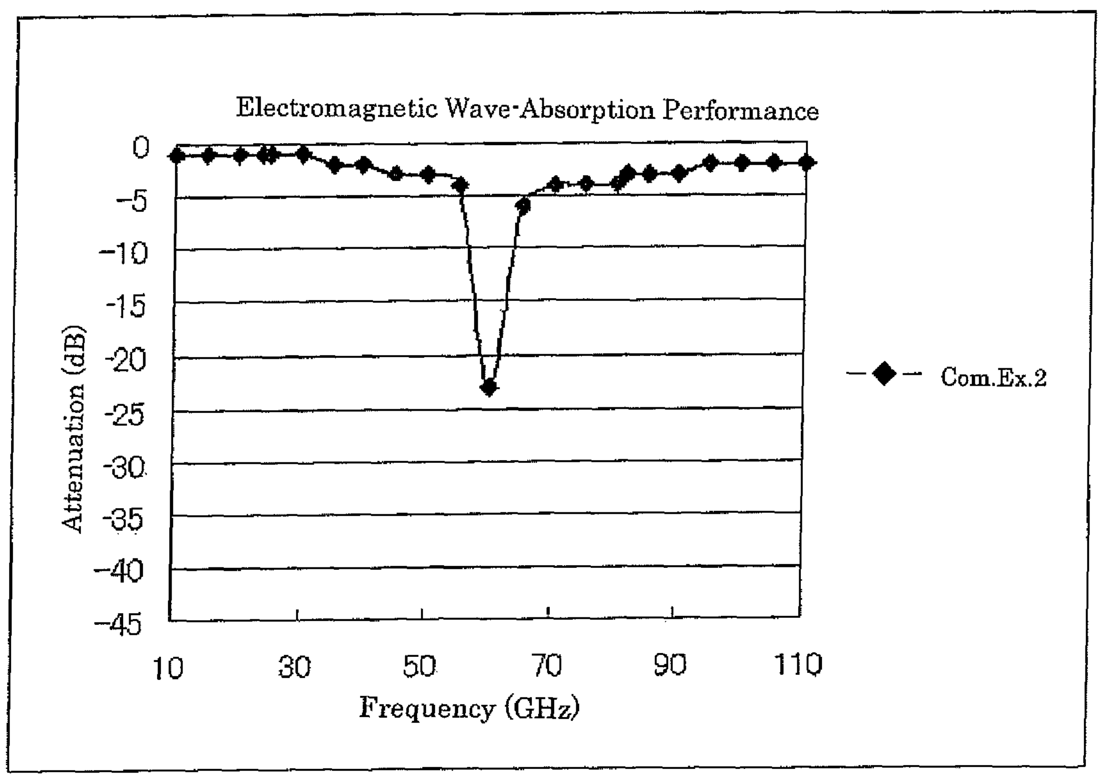
FIG. 9 is a graph similar to FIG. 2 showing the absorption performance of the material of Comparative Example 2.
Figure 10:
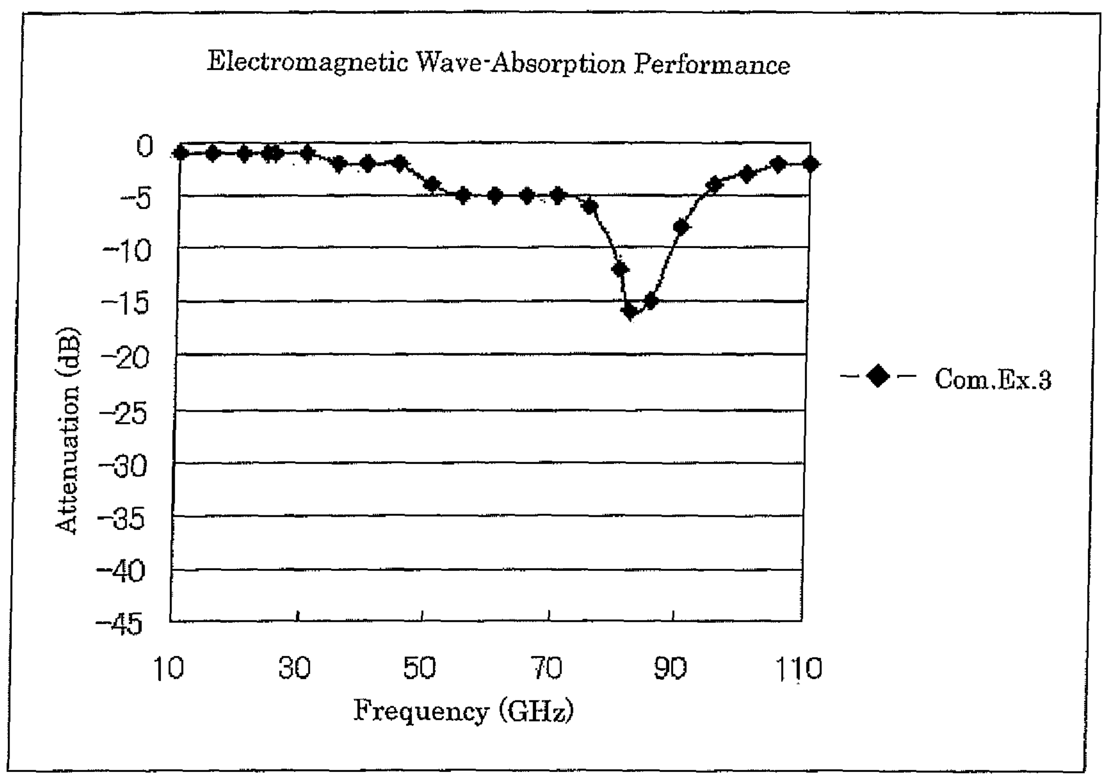
FIG. 10 is a graph similar to FIG. 2 showing the absorption performance of the material of Comparative Example 3.

10 sheets of the above polypyrrole-coated nonwoven fabric were laminated with a two-sided pressure sensitive adhesive tape (No. 5000 NS tape from Nitto Denko Corporation) interposed between adjacent sheets. The thickness of the resulting laminate was 7 mm. An aluminum foil having a thickness of 0.05 mm was overlaid on one side of the laminate using the same two-sided pressure sensitive adhesive tape to produce the electromagnetic wave absorber assembly of Example 1. The attenuation in terms of decrease in intensity of reflected of electromagnetic waves of the resulting assembly was evaluated with the aluminum foil facing downward by the method as described above using the apparatus schematically shown in FIG. 1.

Example 2

The procedure of Example 1 was repeated except that the concentrations of ammonium persulfate and naphthalenesulfonic acids are changed to 4% and 6%, respectively. The percent pick up of polypyrrole was calculated as 1.0%. The average surface resistivity was $1.1\times10^3$ Ohm/square. As in Example 1, 10 sheets of the resulting polypyrrole-coated nonwoven fabric were laminated to produce a laminate of 7 mm thickness. Then an aluminum foil having a thickness of 0.05 mm was overlaid on one side of the laminate to produce an electromagnetic wave absorber assembly of Example 2.

Example 3

20 sheets of polyrrole-coated nonwoven polyester fabric produced in Example 2 were laminated as in Example 1 to produce a laminate of 14 mm thickness. Then an aluminum foil having a thickness of 0.05 mm was overlaid on one side of the laminate to produce the electromagnetic wave absorber assembly of Example 3.

Example 4

The procedure of Example 1 was repeated except that the concentrations of ammonium persulfate and naphthalenesulfonic acid were changed to 6% and 9%, respectively. The percent pick up of polypyrrole was calculated as 1.1%. The average surface resistivity was $3.6\times10^2$ Ohm/square. Four sheets of the polypyrrol-coated nonwoven fabric produced in Example 1 (sheet A), three sheets of the polypyrrole-coated nonwoven fabric produced in Example 2 (sheet B) and three sheets of the polypyrrole-coated nonwoven fabric in this Example (sheet C) were laminated in the order of sheet B, three sheets of sheet C, sheet A and aluminum foil to produce the electromagnetic wave absorber assembly of Example 4.

Example 5

A nonwoven fabric (sheet a) consisting of 99.6% of polyester fiber (3.3 dtex) and 0.4% of carbon fiber and having a basis weight of 1.0 kg/m$^2$ and a thickness of 7.5 mm was cut into an elongated sheet of 50 cm width and 600 cm length. The cut nonwoven fabric was immersed in an aqueous solution containing 1% of ammonium persulfate and 3% of naphthalenesulfonic acid and squeezed by passing through a mangle to remove excessive solution. The wet nonwoven fabric was subjected to in situ vapor-phase polymerization of pyrrole as in Example 1 to obtain polypyrrole-coated nonwoven fabric. The percent pick up of polypyrrole was calculated as 0.7%. The resulting polypyrrole-coated fabric sheet was cut into 10 sheets of 50 cm×50 cm size. The average surface risistivity was $5.5\times10^2$ Ohm/square. An aluminum foil of 0.05 mm was overlaid on a single sheet of the polypyrrole-coated nonwoven fabric using a two-sided pressure sensitive adhesive tape to obtain the electromagnetic wave absorber assembly of Example 5.

Example 6

A nonwoven fabric (sheet b) solely consisting of polyester fiber (3.3 dtex) and having a basis weight of 1.0 kg/m$^2$ and a thickness of 7.5 mm was cut into an elongated sheet of 50 cm width and 600 cm length. The cut length was immersed in an aqueous solution containing 1% of ammonium persulfate and 3% of naphthalenesulfonic acid. Thereafter the procedure of Example 1 was followed to produce a polypyrrole-coated nonwoven fabric having a polypyrrole pick up of 0.7% and an average surface resistivity of $7.3\times10^2$ Ohm/square. An aluminum foil of 0.05 mm thickness was overlaid on the resulting polypyrrole-coated sheet of 50 cm×50 cm size as in Example 5 to obtain the electromagnetic wave absorber assembly of Example 6.

Comparative Example 1

An electromagnetic wave-absorption rubber sheet available from Tayca Corporation under the name of TAYCA GIGACUBE (Ti—Fe based electromagnetic wave-absorption powder-blended EPDM sheet having a peak absorption at 24 GHz) was used for comparison.

Comparative Example 2

The same EPDM sheet as Comparative Example 1 having a peak absorption at 60 GHz was used for comparison.

Comparative Example 3

The same EPDM sheet as Comparative Example 1 having a peak absorption of 84 GHz was used for comparison.

Comparative Example 4

A polyester nonwoven fabric (sheet a) used in Example 5 was cut and laminated with an aluminum foil used in Example 1 to produce a laminate for comparison.

The electromagnetic wave absorbers of Examples 1-6 and electromagnetic wave-absorption EPDM sheets of Comparative Examples 1-3 as well as the nonwoven fabric/aluminum composite sheet of Comparative Example 4 were tested for electromagnetic wave-absorption performance in terms of decrease in wave intensity of reflected waves in a frequency range between 10 GHz and 110 GHz by the reflection power method. The results obtained are shown in Table 1 and FIGS. 2-11.

TABLE 1

| | Electromagnetic wave-absorption performance | | | | | | | | | |
|---|---|---|---|---|---|---|---|---|---|---|
| | ATTENUATION (dB) | | | | | | | | | |
| FRQ | EXAMPLE | | | | | | COMP. EXAM. | | | |
| (GHz) | 1 | 2 | 3 | 4 | 5 | 6 | 1 | 2 | 3 | 4 |
| 10 | −5 | −7 | −8 | −10 | −5 | −6 | −10 | −1 | −1 | 0 |
| 15 | −6 | −7 | −9 | −12 | −6 | −6 | −13 | −1 | −1 | 0 |
| 20 | −7 | −8 | −11 | −13 | −8 | −7 | −19 | −1 | −1 | 0 |
| 24 | −8 | −11 | −14 | −15 | −9 | −8 | −25 | −1 | −1 | −1 |
| 25 | −8 | −11 | −15 | −17 | −10 | −10 | −19 | −1 | −1 | −1 |
| 30 | −9 | −13 | −17 | −18 | −11 | −11 | −11 | −1 | −1 | −1 |
| 35 | −10 | −14 | −18 | −18 | −11 | −12 | −8 | −2 | −2 | −1 |
| 40 | −10 | −15 | −18 | −18 | −11 | −11 | −5 | −2 | −2 | −1 |
| 45 | −10 | −16 | −22 | −19 | −12 | −12 | −4 | −3 | −2 | −1 |
| 50 | −12 | −17 | −23 | −20 | −12 | −12 | −4 | −3 | −4 | −1 |
| 55 | −13 | −18 | −25 | −21 | −13 | −13 | −4 | −4 | −5 | −1 |
| 60 | −14 | −18 | −27 | −22 | −16 | −15 | −3 | −23 | −5 | −1 |
| 65 | −16 | −18 | −29 | −22 | −20 | −18 | −3 | −6 | −5 | −1 |
| 70 | −17 | −19 | −31 | −23 | −21 | −20 | −3 | −4 | −5 | −1 |
| 75 | −17 | −20 | −33 | −24 | −20 | −20 | −3 | −4 | −6 | −1 |
| 80 | −17 | −22 | −35 | −26 | −19 | −20 | −2 | −4 | −12 | −1 |
| 82 | −17 | −23 | −36 | −27 | −20 | −20 | −2 | −3 | −16 | −1 |
| 85 | −17 | −25 | −36 | −28 | −20 | −20 | −2 | −3 | −15 | −1 |
| 90 | −17 | −27 | −37 | −28 | −19 | −19 | −2 | −3 | −8 | −1 |
| 95 | −17 | −29 | −37 | −28 | −18 | −18 | −2 | −2 | −4 | −1 |
| 100 | −17 | −28 | −37 | −29 | −18 | −19 | −1 | −2 | −3 | −1 |
| 105 | −17 | −26 | −38 | −28 | −18 | −18 | −1 | −2 | −2 | −1 |
| 110 | −15 | −24 | −38 | −27 | −19 | −19 | −1 | −2 | −2 | −1 |

As can be appreciated from FIGS. 2-11 and Table 1, the electromagnetic wave absorbers of Examples 1-6 have excellent electromagnetic wave absorption performance over a broadband frequency range.

According to the present invention, it is possible to obtain an electromagnetic wave absorber exhibiting enhanced wave absorption performance throughout every wave length range by laminating a plurality of electro-conductive sheets based on their wave absorption performance as determined in the foregoing Examples.

The electromagnetic wave absorption sheets of Comparative Examples 1-3 show a frequency-dependent absorption performance having a sharp peak at a specific frequency as opposed to the absorbers of the present invention. Since the absorption peak of the EPDM sheets of Comparative Examples 1-3 vary depending upon their thickness, it is necessary to adjust their thickness individually depending upon a target frequency.

Figure 11:
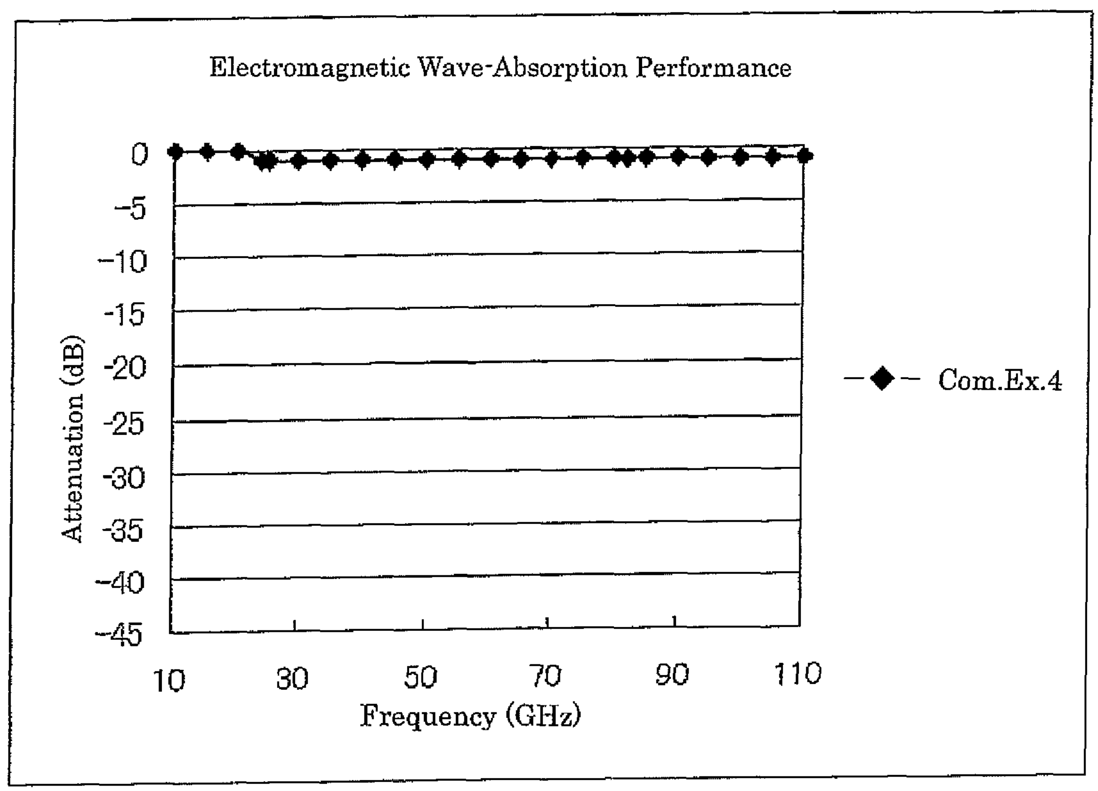
FIG. 11 is a graph similar to FIG. 2 showing the absorption performance of the material of Comparative Example 4.
Figure 12:
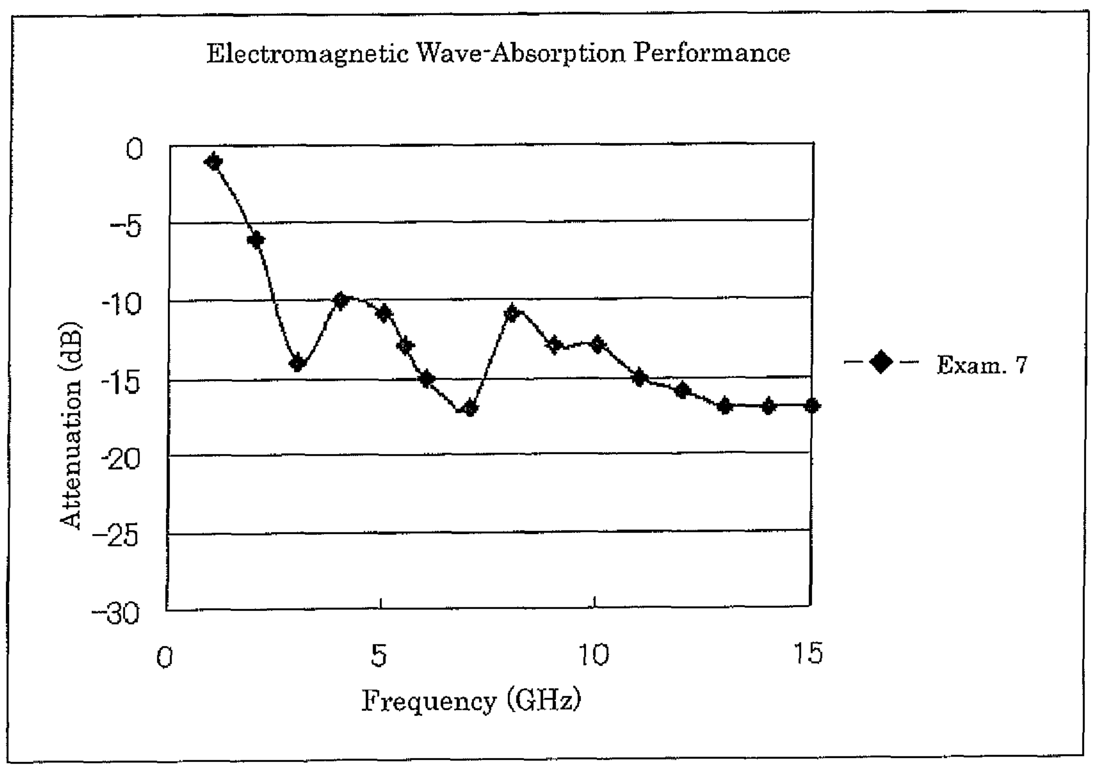
FIG. 12 is a graph showing the electromagnetic wave absorption performance of the material of Example 7 over a frequency range between 1 GHz and 15 GHz.
Figure 13:
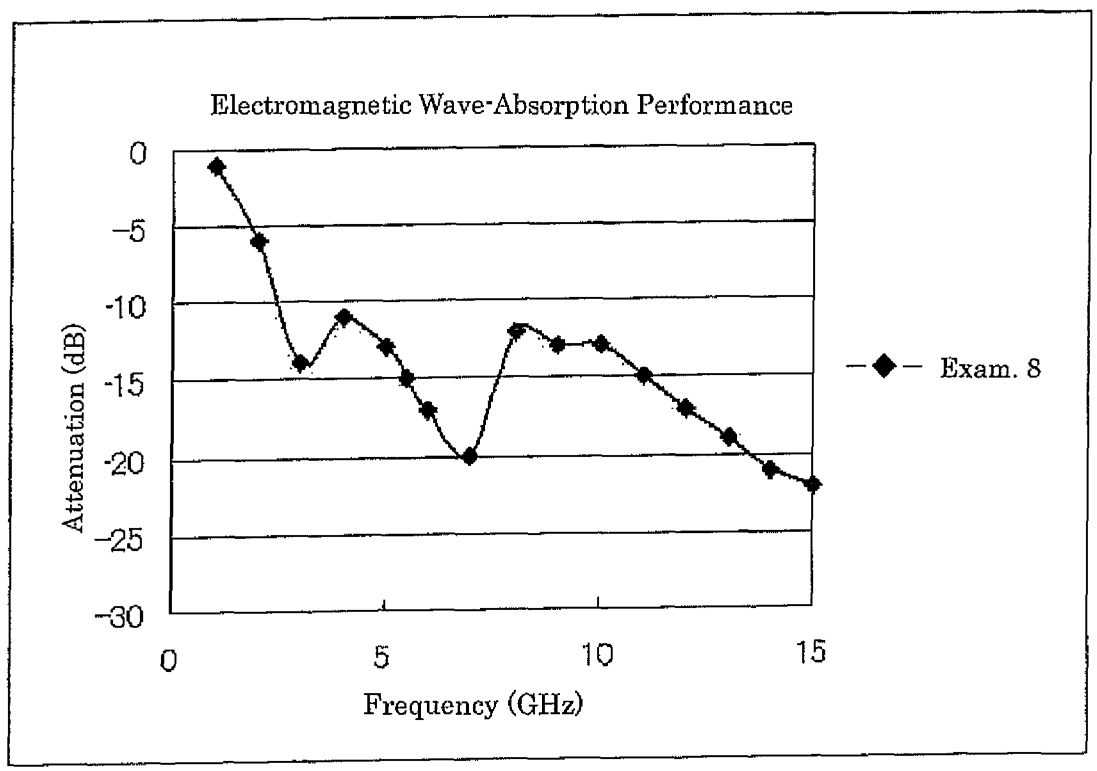
FIG. 13 is a graph similar to FIG. 12 showing the absorption performance of the material of Example 8.
Figure 14:
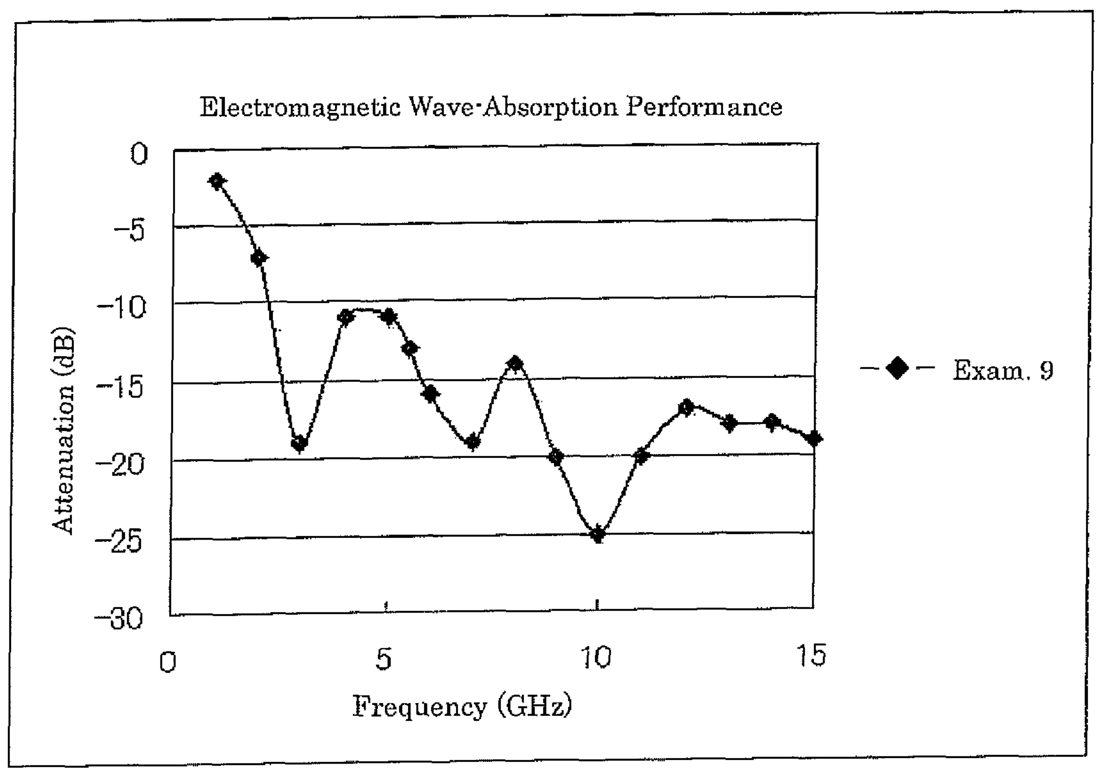
FIG. 14 is a graph similar to FIG. 12 showing the absorption performance of the material of Example 9.
Figure 15:
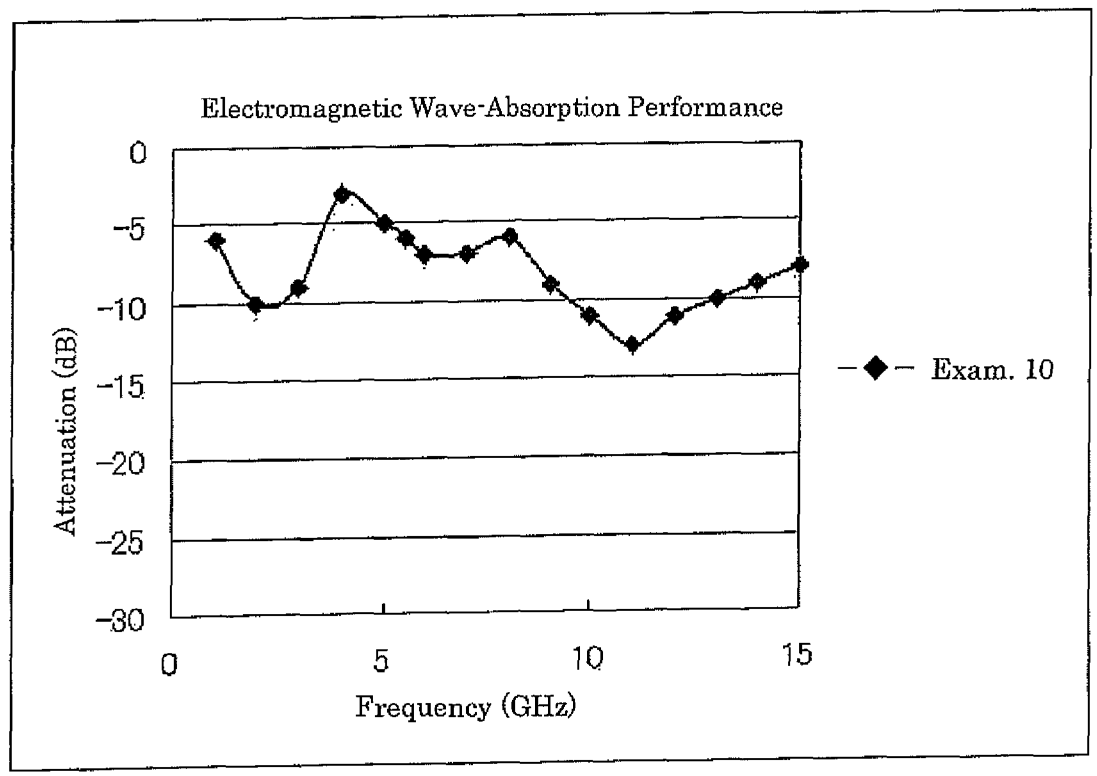
FIG. 15 is a graph similar to FIG. 12 showing the absorption performance of the material of Example 10.
Figure 16:
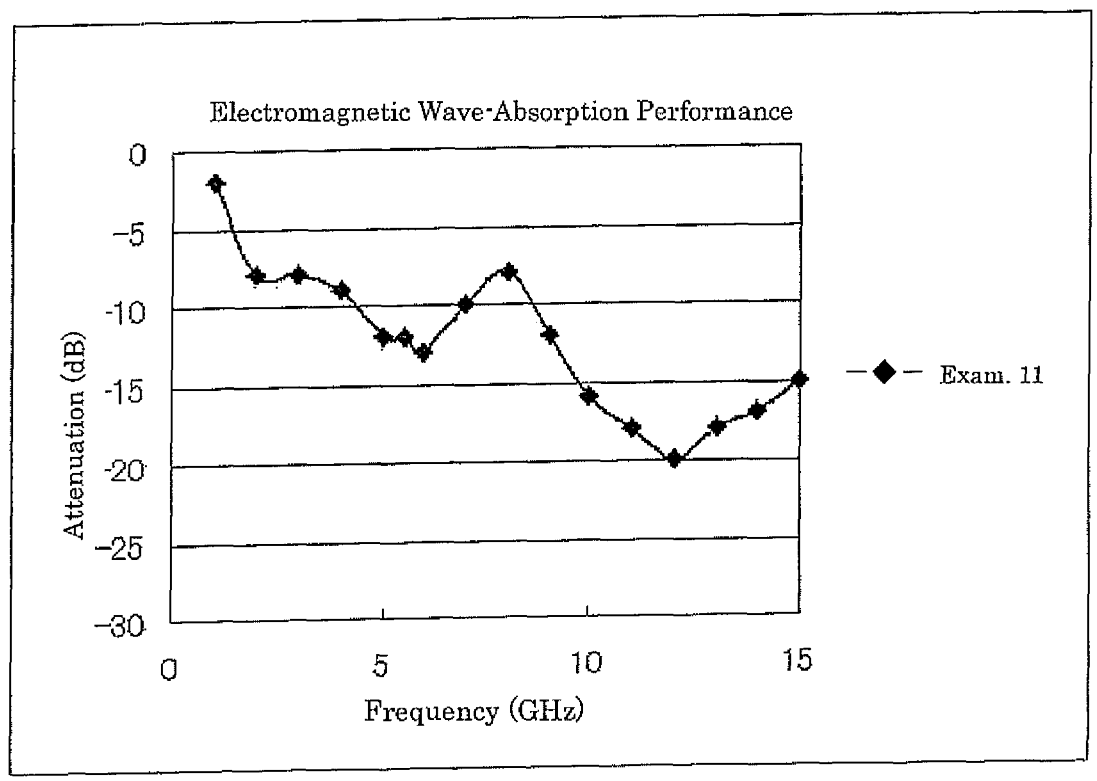
FIG. 16 is a graph similar to FIG. 12 showing the absorption performance of the material of Example 11.
Figure 17:
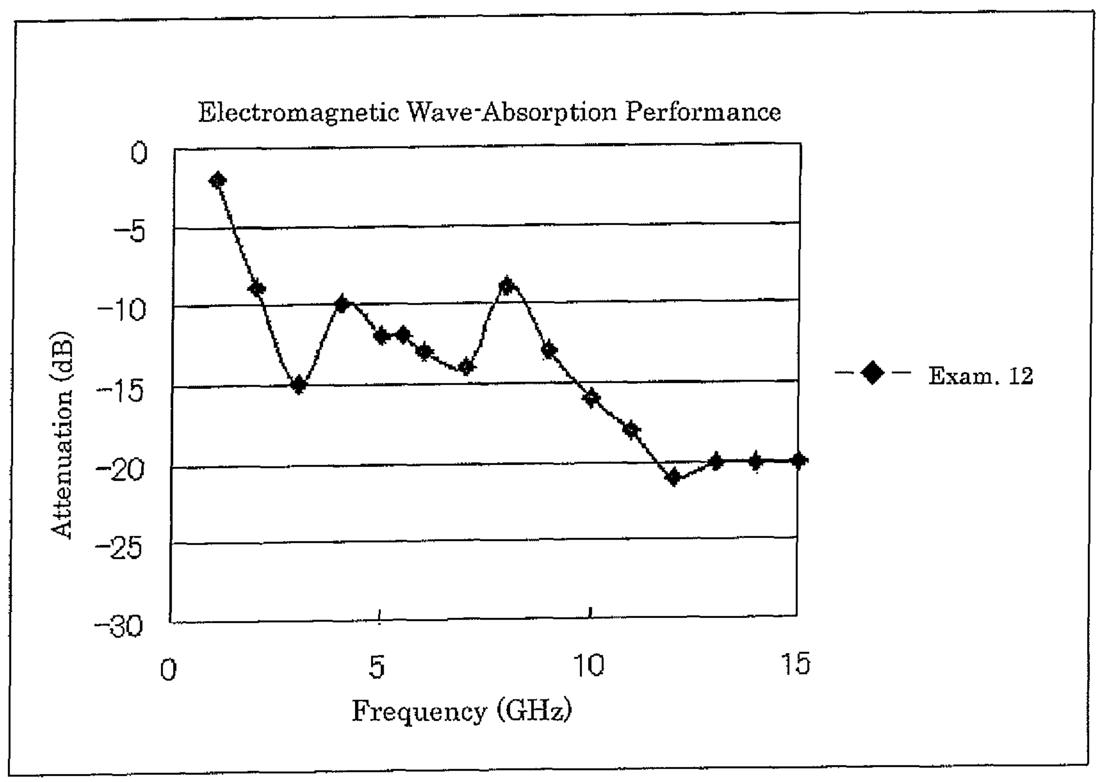
FIG. 17 is a graph similar to FIG. 12 showing the absorption performance of the product of Example 12.
Figure 18:
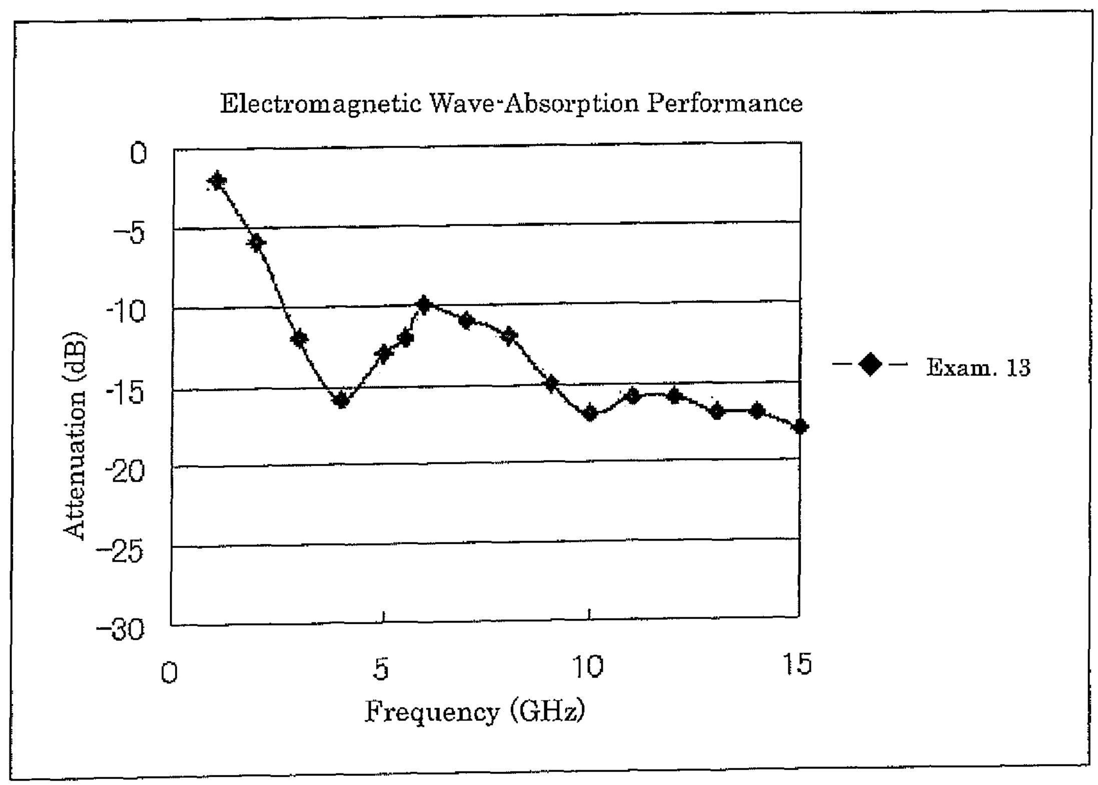
FIG. 18 is a graph similar to FIG. 12 showing the absorption performance of the material of Example 13.
Figure 19:
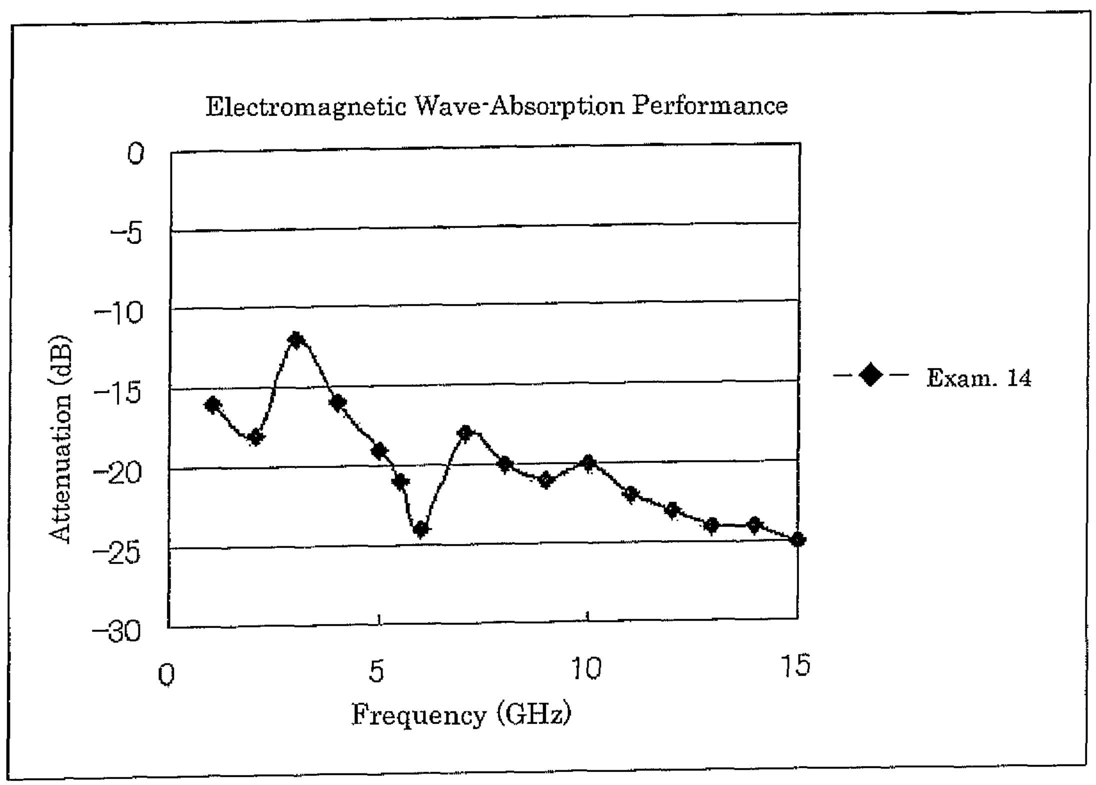
FIG. 19 is a graph similar to FIG. 12 showing the absorption performance of the material of Example 14.
Figure 20:
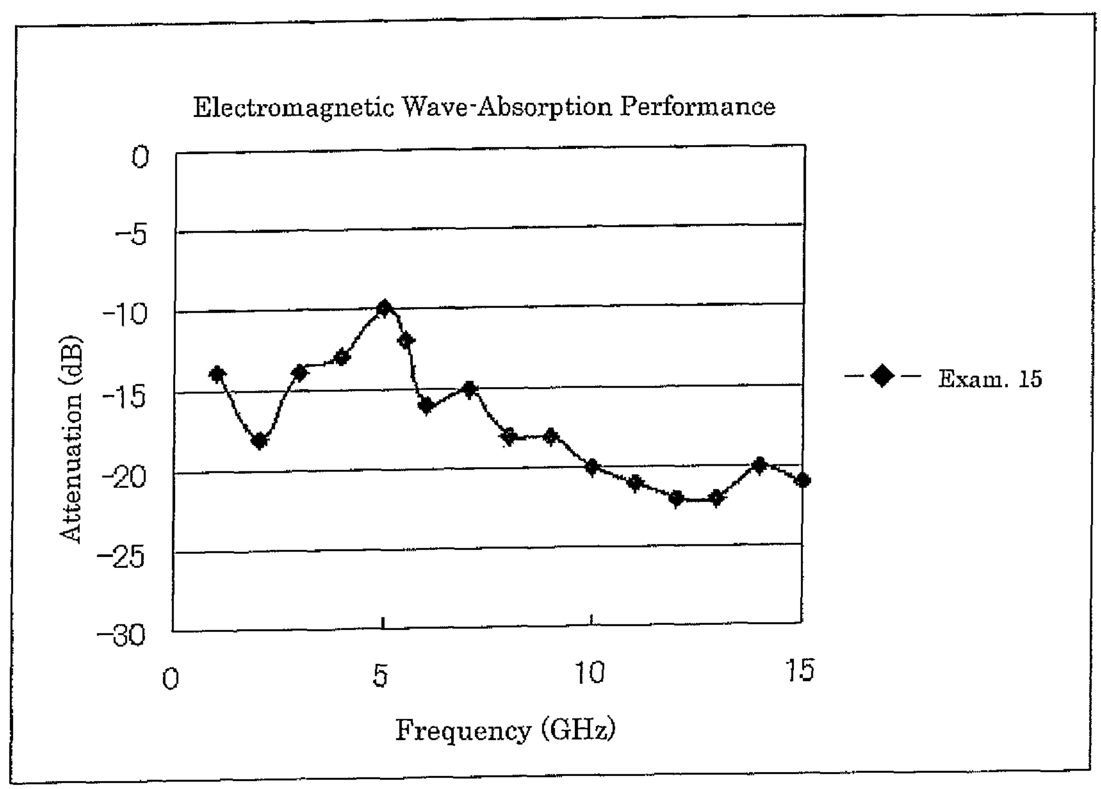
FIG. 20 is a graph similar to FIG. 12 showing the absorption performance of the material of Example 15.
Figure 21:
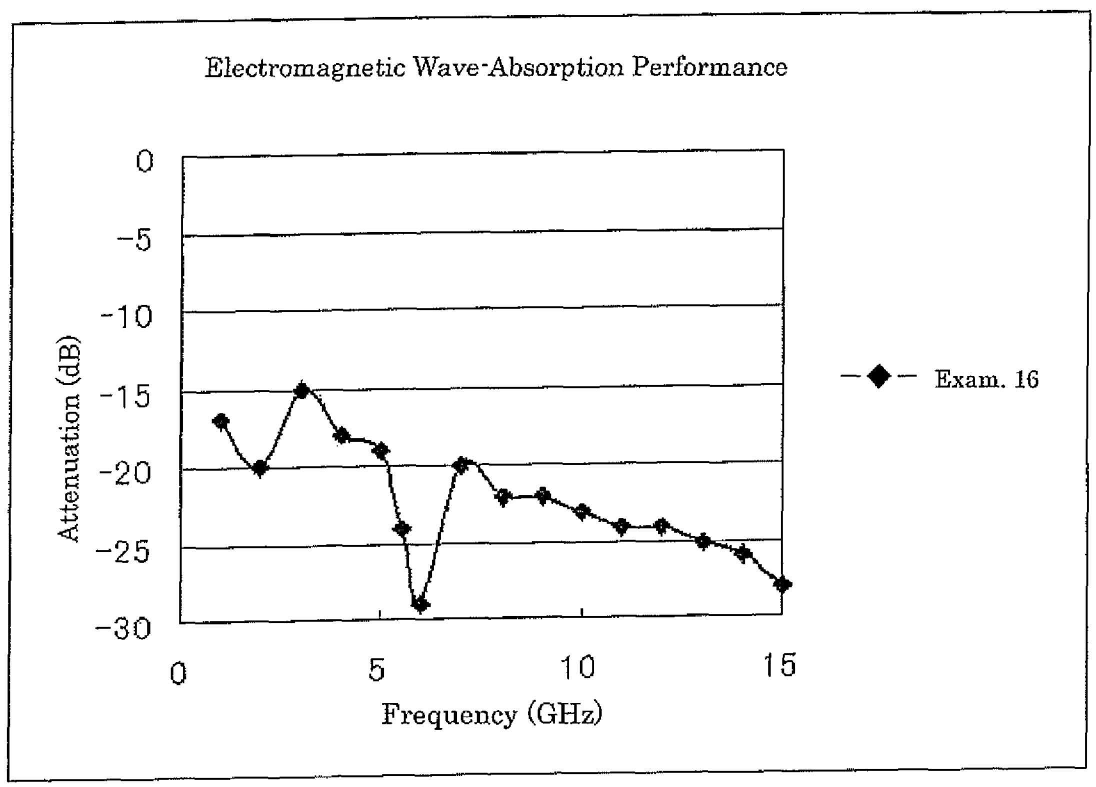
FIG. 21 is a graph similar to FIG. 12 showing the absorption performance of the material of Example 16.
Figure 22:
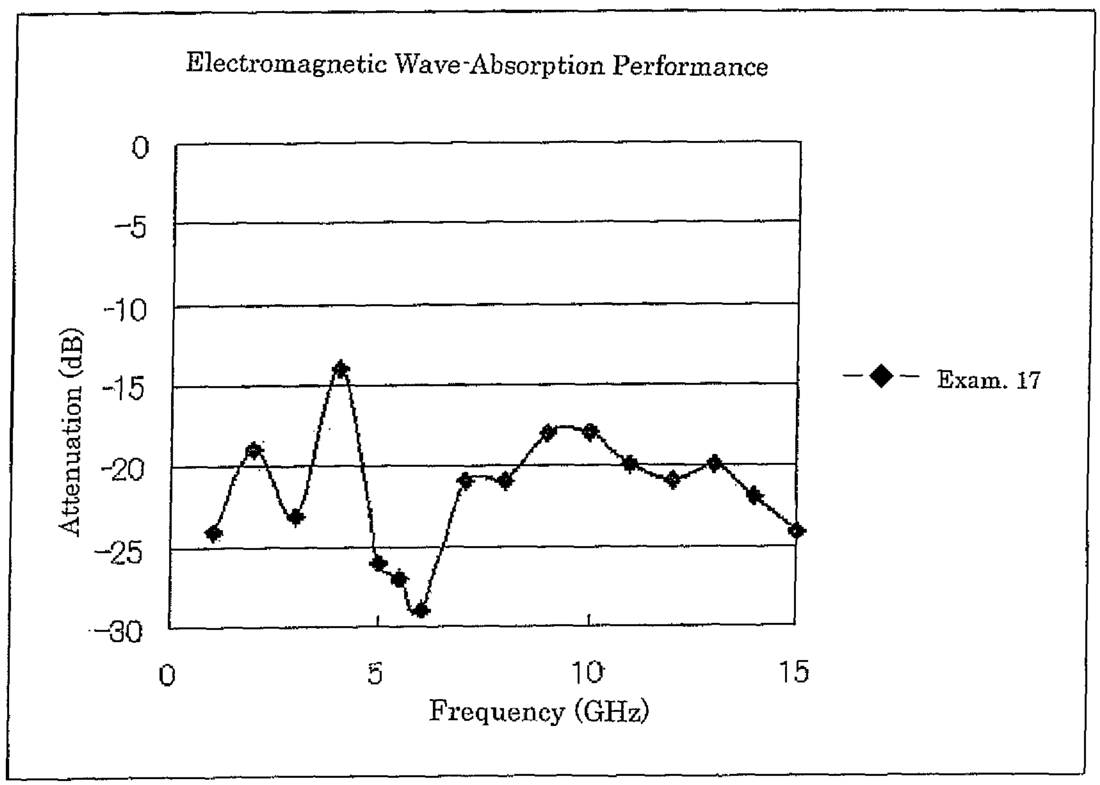
FIG. 22 is a graph similar to FIG. 12 showing the absorption performance of the material of Example 17.
Figure 23:
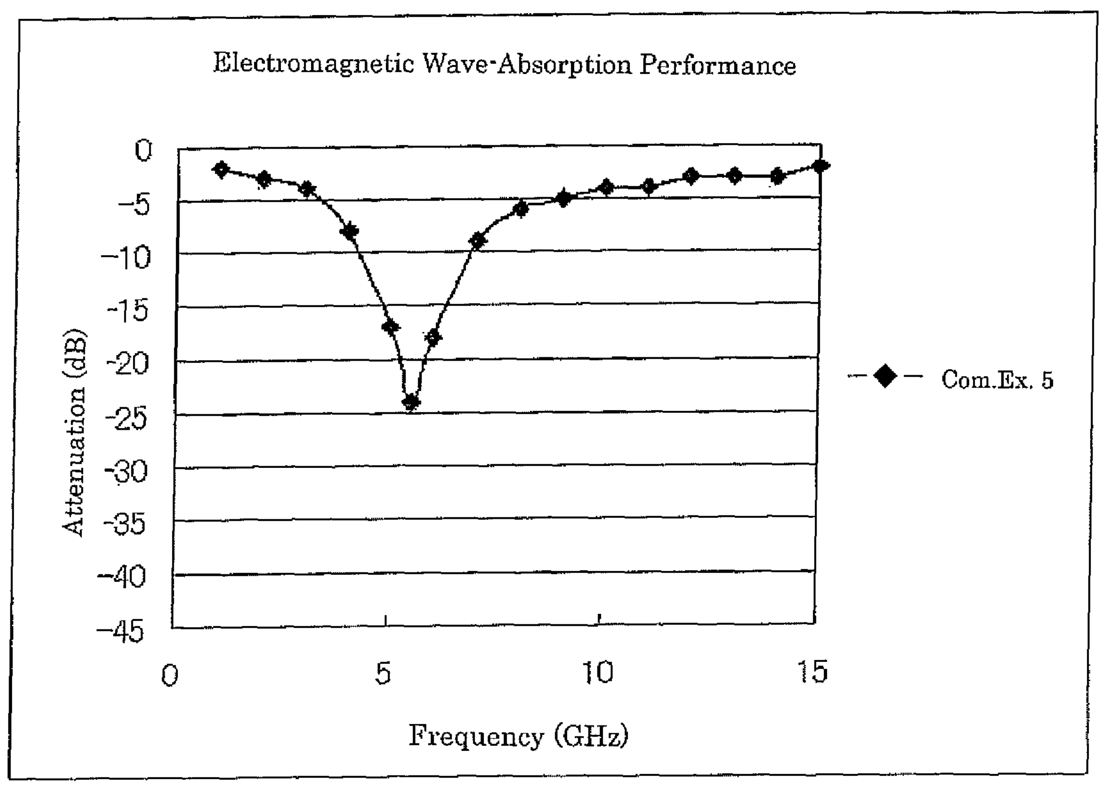
FIG. 23 is a graph similar to FIG. 12 showing the absorption performance of the material of Comparative Example 5.
Figure 24:
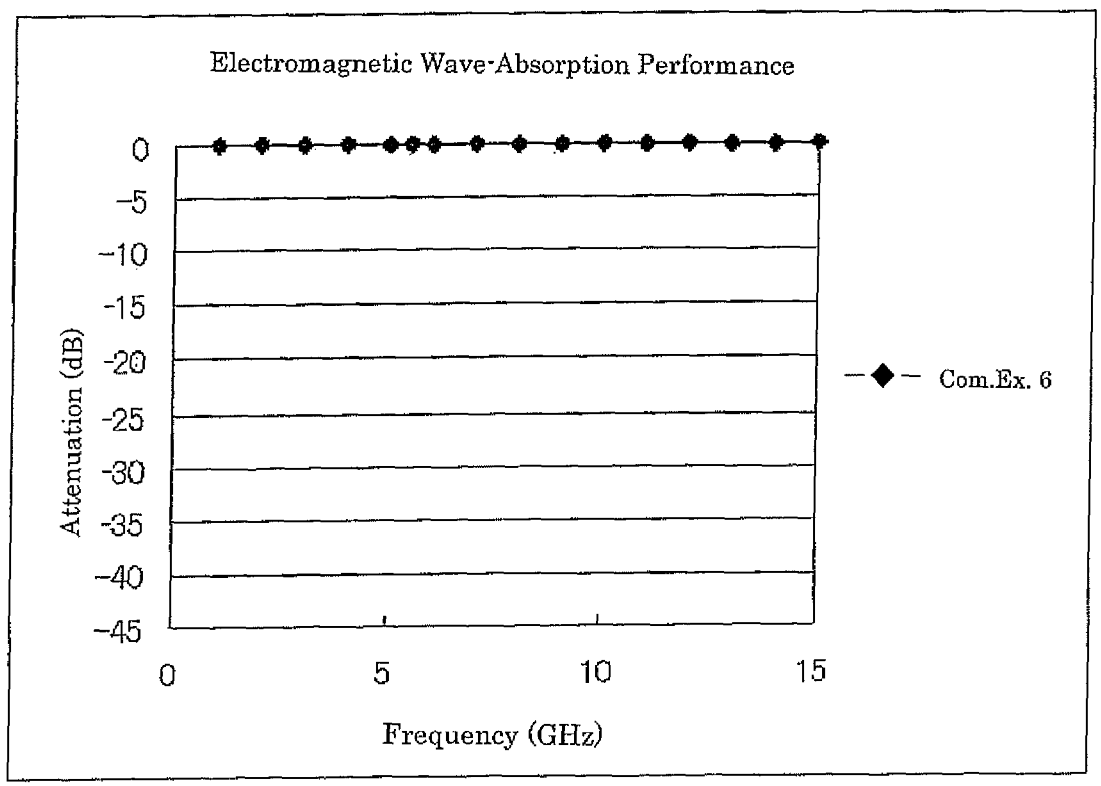
FIG. 24 is a graph similar to FIG. 12 showing the absorption performance of the material of Comparative Example 6.
Figure 25:
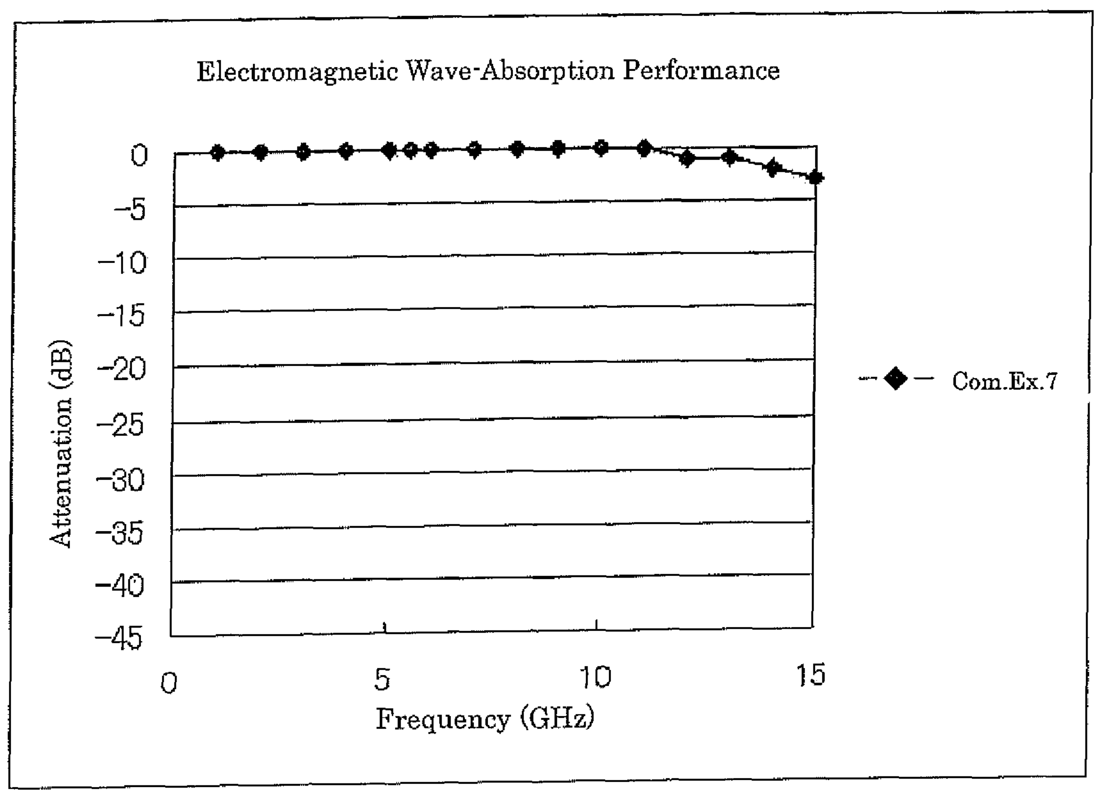
FIG. 25 is a graph similar to FIG. 12 showing the absorption performance of the material of Comparative Example 7.

The fabric sheet of Comparative Example 4 does not absorb electromagnetic waves at all as shown in FIG. 11.

1.2 Attenuation of Electromagnetic Waves in the Frequency Range Between 1 GHz and 15 GHz

Example 7

The procedure of Example 1 was repeated using the nonwoven fabric sheet (sheet a) used in Example 5 except that the sheet was immersed in an aqueous solution containing 1.5% of ammonium persulfate and 4.5% of naphthalenesulfonic acid. An electroconductive fabric sheet (sheet D) having an average surface resistivity of $1.5\times10^3$ Ohm/square and a pick up of polypyrrole of 0.8% was obtained.

Similarly, an electroconductive fabric sheet (sheet E) was prepared from the sheet used in Example 5 by immersed in a solution containing 2.0% of ammonium persulfate and 6.0% naphthalenesulfonic acid. The average surface resistivity and the pick up of polypyrrole of sheet E were $7.3\times10^2$ Ohm/square and 0.8%, respectively.

Then one sheet of sheet D, one sheet of sheet E and the aluminum foil used in Example 1 were laminated to obtain an electromagnetic wave absorber assembly in which sheet E is sandwiched between sheet D and aluminum foil.

Comparative Example 5

An electromagnetic wave absorption rubber sheet available under the name of TAYCA GIGACUBE (EPDM sheet incorporating a Ti—Fe based electromagnetic wave absorption powder) having a peak absorption at 5.5 GHz was laminated with the aluminum foil used in Example 1 to produce a laminate for comparison.

Comparative Example 6

A nonwoven fabric sheet (sheet c) consisting of 39.2% of polyester fiber of 3.3 dtex, 25.0% of polyester fiber of 4.4 dtex, 34.3% of polyester fiber of 6.6 dtex and 1.5% of carbon fiber and having a thickness of 3.1 mm and a basis weight of 450 g/m$^2$ was overlaid with the aluminum foil used in Example 1. The resulting laminate was used for comparison.

Example 8

A nonwoven fabric sheet used in Comparative Example 6 (sheet c) was adhesively overlaid on the side opposite to the aluminum foil of the electromagnetic wave absorption assembly obtained in Example 7. Elevation of electromagnetic wave absorption performance of the assembly of Example 7 was confirmed by overlaying nonwoven fabric sheet used in Comparative Example 6 in the frequency range between 1 GHz and 15 GHz.

Comparative Example 7

A nonwoven fabric sheet (sheet d) consisting of 70.0% of polyester fiber and 30.0% of acrylic fiber having a coating of cupric sulfide and having a basis weight of 36 $g/m^2$ and a thickness of 0.2 mm was laminated with the aluminum foil used in Example 1 to produce a laminate for comparison.

Example 9

The nonwoven fabric sheet (sheet d) comprising cupric sulfide-coated acrylic fiber used in Comparative Example 7 was interposed into the electromagnetic wave absorber assembly of Example 7 between sheet E and sheet D. It was confirmed that the addition of the sheet d used in Comparative Example 7 as part of the laminate has an effect of elevating the absorption performance at a specific frequency region while maintaining the absorption performance over a broadband frequency range between 1 GHz and 15 GHz.

Example 10

An electromagnetic wave absorption assembly was produced by laminating sheet d used in Comparative Example 7, sheets D and E used in Example 7 and an aluminum foil in succession. It was confirmed that the absorption performance was elevated at a specific frequency region while maintaining the absorption performance over a broadband frequency range between 1 GHz and 15 GHz.

Example 11

The procedure of Example 1 was repeated using the nonwoven fabric sheet (sheet a) used in Example 5 except that the sheet was immersed in a solution containing 1.8% of an ammonium persulfate and 5.4% of naphthalenesulfonic acid. An electromagnetic wave absorption sheet (sheet F) having an average surface resistivity of $9.1\times10^2$ Ohm/square and a polypyrrole pick up of 0.8% was obtained.

The sheet F was laminated with the sheet D prepared in Example 7 and further with the aluminum foil used in Example 1 on the sheet F side. An electromagnetic wave absorber assembly was obtained.

Example 12

Two sheets of nonwoven fabric (sheet a) used in Example 5 were laminated on the sheet D side of the electromagnetic wave absorber assembly obtained in Example 11. It was confirmed that the absorption performance was elevated at specific frequency range while maintaining the absorption performance over a broadband frequency range between 1 GHz and 15 GHz.

Example 13

The procedure of Example 1 was repeated using the nonwoven fabric sheet (sheet a) used in Example 5 except that the sheet was immersed in a solution containing 0.7% of ammonium persulfate and 2.1% of naphthalenesulfonic acid. An electromagnetic wave-absorption sheet (sheet G) having an average surface resistivity of $3.6\times10^3$ Ohm/square and a polypyrrole pick up of 0.6% was obtained. Two sheets of sheet G, a single sheet of sheet F and the aluminum foil used in Example 1 were successively laminated in this order to obtain an electromagnetic wave absorber assembly.

Example 14

Analogous to Example 1, an electromagnetic wave absorption sheet having an average surface resistibility of $5.5\times10^2$ Ohm/square and a polypyrrole pick up of 0.9% (sheet H) was produced from the nonwoven fabric (sheet a) used in Example 5 by the process of Example 1 including the step of immersing the sheet in a solution containing 2.5% of ammonium persulfate and 7.5% of naphthalenesulfonic acid.

Similarly, an electromagnetic wave absorption sheet having an average surface resistibility of $1.1\times10^3$ Ohm/square and a polypyrrole pick up of 0.8% (sheet I) was produced from the same nonwoven fabric using a solution containing 1.7% of ammonium persulfate and 5.1% of naphthalenesulfonic acid.

Similarly, an electromagnetic wave absorption sheet having an average surface resistivity of $1.8\times10^3$ Ohm/square and a polypyrrole pick up of 0.7% (sheet J) was produced from the same nonwoven fabric using a solution containing 1.3% of ammonium persulfate and 3.9% of naphthalenesulfonic acid.

A single sheet each of sheet F, sheet H, sheet I and sheet J and two sheets of sheet G and the aluminum foil used in Example 1 were laminated together in the order of two sheets of sheet G, sheet J, sheet I, sheet F, sheet H and aluminum foil to obtain an electromagnetic wave absorber assembly.

Example 15

Analogous to Example 14, sheet J, two sheets of the nonwoven fabric used in Example 5 (sheet a), sheet I, sheet F, sheet H and the aluminum foil were laminated in the stated order to obtain an electromagnetic wave absorber assembly.

Example 16

Two sheets of the nonwoven fabric (sheet a) used in Example 5 were further laminated on the sheet G side of the laminate produced in Example 14 to obtain an electromagnetic wave-absorption assembly.

Example 17

A single sheet of the nonwoven fabric (sheet a) used in Example 5, sheet G, sheet a, sheet G, sheet J, sheet I, sheet F, sheet H and the aluminum were laminated in the stated order to obtain an electromagnetic wave absorber assembly.

The electromagnetic wave absorber laminates of Examples 7-17, electromagnetic wave-absorption EPDM sheet of Comparative Example 5, and nonwoven fabric sheets used in Comparative Examples 6 and 7 were tested for electromagnetic wave absorption performance in terms of decrease in the intensity of reflected waves over the frequency range between 1 GHz and 15 GHz by the reflection power method. The results are shown in Table 2 and FIGS. 12-25.

TABLE 2

| FR (GHz) | Electromagnetic wave-absorption performance — ATTENUATION (dB) — EXAMPLE 7 | 8 | 9 | 10 | 11 | 12 | 13 | 14 | 15 | 16 | 17 | COM. EX. 5 | 6 | 7 |
|---|---|---|---|---|---|---|---|---|---|---|---|---|---|---|
| 1 | −1 | −1 | −2 | −6 | −2 | −2 | −2 | −16 | −14 | −17 | −24 | −2 | 0 | 0 |
| 2 | −6 | −6 | −7 | −10 | −8 | −7 | −6 | −18 | −18 | −20 | −19 | −3 | 0 | 0 |
| 3 | −14 | −13 | −19 | −9 | −8 | −15 | −12 | −12 | −14 | −11 | −23 | −4 | 0 | 0 |
| 4 | −10 | −11 | −11 | −3 | −9 | −10 | −16 | −20 | −13 | −14 | −9 | −8 | 0 | 0 |
| 5 | −11 | −13 | −11 | −5 | −12 | −12 | −13 | −19 | −10 | −19 | −26 | −17 | 0 | 0 |
| 5.5 | −13 | −15 | −13 | −6 | −12 | −12 | −12 | −21 | −12 | −24 | −27 | −24 | 0 | 0 |
| 6 | −15 | −17 | −16 | −7 | −13 | −13 | −10 | −24 | −16 | −29 | −29 | −18 | 0 | 0 |
| 7 | −17 | −20 | −19 | −7 | −10 | −14 | −11 | −18 | −15 | −20 | −21 | −9 | 0 | 0 |
| 8 | −11 | −12 | −14 | −6 | −8 | −9 | −12 | −26 | −18 | −22 | −21 | −6 | 0 | 0 |
| 9 | −13 | −12 | −20 | −9 | −12 | −11 | −15 | −22 | −18 | −22 | −18 | −5 | 0 | 0 |
| 10 | −13 | −13 | −25 | −11 | −16 | −16 | −17 | −20 | −20 | −23 | −18 | −4 | 0 | 0 |
| 11 | −15 | −15 | −20 | −13 | −20 | −16 | −16 | −22 | −21 | −24 | −20 | −4 | 0 | 0 |
| 12 | −16 | −17 | −17 | −11 | −22 | −19 | −16 | −23 | −22 | −24 | −21 | −3 | 0 | −1 |
| 13 | −17 | −19 | −14 | −10 | −20 | −20 | −17 | −24 | −22 | −25 | −20 | −3 | 0 | −1 |
| 14 | −17 | −21 | −13 | −9 | −17 | −20 | −17 | −24 | −20 | −26 | −22 | −3 | 0 | −2 |
| 15 | −17 | −22 | −12 | −8 | −15 | −20 | −18 | −25 | −21 | −28 | −24 | −2 | 0 | −3 |

As can be appreciated from FIGS. 12-25 and Table 2, the electromagnetic wave absorption assembly of Examples 7-17 exhibit a high absorption performance in the frequency range of 1-15 GHz, especially 3-15 GHz.

The absorber of Example 9 shows an elevated absorption at specific frequencies while maintaining the absorption performance in the broadband frequency range of 1-15 GHz.

As can be appreciated from the test results of the absorbers of Examples 8, 12 and 16, combined use of polypyrrole-coated fabric sheets and one or more fabric sheets free of a polypyrrole coating layer in the laminate has an effect of enhancing the absorption performance in the broadband frequency range.

In contrast, the EPDM sheet of Comparative Example 5 exhibited a frequency-dependent absorption performance at a specific frequency indicating that the EPDM sheet is not capable of absorbing electromagnetic waves in the broadband frequency range as the absorber of the present invention.

As shown by the test results, the assemblies of Comparative Examples 6 and 7 comprising a nonwoven fabric free from polypyrrole coating layer and an aluminum foil do not exhibit an electromagnetic wave absorption performance in the test frequency range.

2. Evaluation of Electromagnetic Wave Shielding

Example 1a

A nonwoven fabric available from Mitsubishi Paper Mills Ltd. under the name of NANOWIPER-H140 (40 $g/m^2$ basis weight, 0.25 mm thickness, made of mixture of polyester and acrylic fibers) was cut into an elongated sheet of 20 cm width and 100 cm length. The cut fabric was immersed in an aqueous solution containing 16% of ammonium persulfate and 14% of p-toluenesulfonic acid (pH 0.2) and squeezed by passing through a mangle to remove excessive solution. Then wet fabric was placed in a reaction chamber in flattened state while evaporating pyrrole monomer in the reaction chamber. The wet nonwoven fabric was allowed to contact with pyrrole vapor for 10 minutes in the reaction chamber whereupon in situ vapor-phase polymerization took place on the nonwoven fabric. After the reaction, the nonwoven fabric was removed from the reaction chamber, washed with 10 L of distilled water three times, removing water using the mangle, and dried at 105° C. for 1 hour. The pick up of polypyrrole was calculated as 1.4% from the difference in weight of the fabric before and after the treatment.

The resulting polypyrrole-coated nonwoven fabric was cut into five sheets of 15×15 cm size and determined their surface resistibility. The average surface resistivity of 5 sheets was $7.3\times10^2$ Ohm/square.

The resulting conductive nonwoven fabric of 5×5 cm size was placed on the microstrip line having 50 Ohm resistance in close contact, and the transmission attenuation (S21) and the reflection attenuation (S11) in terms of decrease in the intensities of transmitted and reflected waves, respectively were measured by a network analyzer according to the microstrip method.

Example 2a

The procedure of Example 1a was repeated except that the nonwoven fabric was changed to WIPER-WO-ME150H available from Mitsubishi Paper Mills Ltd. (a nonwoven fabric having a basis weight of 150 $g/m^2$ and a thickness of 0.5 mm and consisting of 100% of polyester ultra-fine fiber) and an aqueous solution containing 12% of ammonium persulfate and 14% of naphthalenesulfonic acid was used. The pick up of polypyrrole was calculated as 1.6% and the average surface resistivity was $7.3\times10^1$ Ohm/square.

Example 3a

Using the nonwoven fabric of Example 2a the procedure of Example 1a was repeated except that a solution containing 18% of ammonium persulfate, 10% of p-toluenesulfonic acid and 7% of naphthalenesulfonic acid was used. The pick up of polypyrrole was calculated as 1.8% and the average surface resistivity was $2.9\times10^1$ Ohm/square.

Example 4a

Using the nonwoven fabric of Example 2a, the procedure of Example 1a was repeated except that a solution containing 12% of ammonium persulfate, 6% of p-toluenesulfonic acid, and 6% of naphthalenesulfonic acid was used. The pick up of polypyrrole was calculated as 1.5%. The average surface resistivity was $2.2\times10^2$ Ohm/square.

Example 5a

The procedure of Example 1a was repeated except that the nonwoven fabric was changed to a knitted fabric made of 80% polyester and 20% nylon having a basis weight of 120 g/$m^2$ and a thickness of 0.3 mm. The pick up of polypyrrole was calculated as 1.5%. The average surface resistivity was $3.3\times10^2$ Ohm/square.

Example 6a

The procedure of Example 1a was repeated except that pyrrole monomer was changed to 3,4-ethylenedioxythiophene and the solution containing an oxizing agent and a dopant was changed to TAYCATRON 40E available from Tayca Corporation. The pick up of poly(3,4-ethylenedioxythiophene) was calculated as 1.4%. The average surface resistivity was $3.3\times10^2$ Ohm/square.

Example 7a

The procedure of Example 2a was repeated except that a solution containing 18% of ammonium persulfate at pH 4 and 18% of p-toluenesulfonic acid adjusted at pH4 with 10% ammonia water was used. The pick up of polypyrrole was calculated as 1.8%. The average surface resistivity was $2.2\times10^2$ Ohm/square.

Comparative Example 1a

The procedure of Example 1a was repeated except that a woven fabric made of 100% polyester ultrafine fiber having a basis weight of 120 g/$m^2$ and a thickness of 0.2 mm was immersed in a solution containing 2% of ammonium persulfate 1% of p-toluenesulfonic acid and 1% of naphthalenesulfonic acid. The pick up of polypyrrole was calculated as 1.3%. The average surface resistivity was $2\times10^7$ Ohm/square.

Comparative Example 2a

The procedure of Example 1a was repeated except that the substrate was immersed in a solution containing 2% of ammonium persulfate, 1% of p-toluenesulfonic acid and 1% of naphthalenesulfonic acid. The pick up of polypyrrole was calculated as 1.3%. The average surface resistivity was $1.8\times10^5$ Ohm/square.

The electromagnetic absorbers having electromagnetic wave shielding performance obtained in Examples 1a-7a and the electro-conductive fabric sheets of Comparative Examples 1a and 2a were tested for reflection attenuation (S11) and transmission attenuation in terms of decrease in the intensities of reflected and transmitted waves, respectively by the microstrip method. The results obtained are shown in Table 3 below.

TABLE 3

| | | Attenuation (dB) | | | | | |
|---|---|---|---|---|---|---|---|
| | Freq. (GHz) | Metal (Cu) | Ex. 1a | Ex. 2a | Ex. 3a | Ex. 4a | Comp. Ex. 1a |
| Reflection (S11) | 1 | −36 | −25 | −25 | −26 | −24 | −3 |
| | 1.5 | −38 | −23 | −36 | −38 | −33 | −4 |
| | 3 | −40 | −25 | −20 | −23 | −18 | −4 |
| | 5 | −32 | −14 | −22 | −25 | −20 | −3 |
| Transmission (S21) | 1 | −15 | −5 | −5 | −8 | −5 | 0 |
| | 1.5 | −12 | −6 | −8 | −11 | −6 | 0 |
| | 3 | −7 | −10 | −13 | −19 | −10 | 0 |
| | 5 | −14 | −13 | −20 | −27 | −15 | 0 |

As can be appreciated from Table 3, a high electromagnetic wave shielding performance is attained by adjusting the surface resistivity of the conductive fabric sheet having a conductive polymer coating between $1\times10^0$ Ohm/square and $1\times10^3$ Ohm/square.

According to the present invention, it is possible to obtain a broadband wave absorber having a high wave shielding performance by adjustion the surface resistivity of conductive fabric sheet in the above ranges.

The invention claimed is:

1. An electromagnetic wave absorber comprising a plurality of electroconductive fabric sheets laminated together, said plurality of electroconductive fabric sheets each having an electroconductive polymer coating on a fibrous substrate sheet, and a surface resistivity between $1\times10^0$ Ohm/square and $1\times10^4$ Ohm/square, wherein said plurality of electroconductive fabric sheets exerts wave attenuation higher than 10 dB at least in a whole part in a frequency range between 35 GHz and 110 GHz.

2. An electromagnetic wave absorber according to claim 1 further exhibiting an electromagnetic wave shielding performance wherein the surface resistivity of said electroconductive fabric sheet is adjusted between $1\times10^0$ Ohm/square and $1\times10^3$ Ohm/square.

3. An electromagnetic wave absorber according to claim 1 wherein said electroconductive polymer is polypyrrole, polythiophene, copolymers of pyrrole with a derivative thereof, or copolymers of thiophene with a derivative thereof.

4. An electromagnetic wave absorber according to claim 1 wherein said fabric substrate sheet is a woven, nonwoven or composite fabric made of a synthetic fiber.

5. An electromagnetic wave absorber according to claim 1 wherein said fabric substrate sheet is free from a metal.

6. An electromagnetic wave absorber material according to claim 1 wherein said fabric sheet is, at least partially, made of copper sulfide-coated fiber or carbon fiber.

7. An electromagnetic wave absorber according to claim 1 wherein a metal foil is overlaid on at least one side thereof.

8. An electromagnetic wave absorber according to claim 1 having a thickness from 0.2 mm to 100 mm.

9. An electromagnetic wave absorber according to claim 1 wherein a plurality of the electroconductive fabric sheets having different surface resistivities are laminated.

10. An electromagnetic wave absorber according to claim 1 wherein at least one layer of said laminate consists of said fabric sheet free from said electroconductive polymer coating.

11. An electromagnetic wave absorber according to claim 1 wherein the electroconductive polymer coating is free of metallic powder.

* * * * *